(12) United States Patent
Polisi et al.

(10) Patent No.: US 11,726,542 B2
(45) Date of Patent: *Aug. 15, 2023

(54) POWER MANAGEMENT CIRCUIT AND METHOD

(71) Applicant: STMicroelectronics S.r.l., Agrate Brianza (IT)

(72) Inventors: Vincenzo Polisi, Santa Maria di Licodia (IT); CalogeroAndrea Trecarichi, Gela (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,266

(22) Filed: Aug. 8, 2022

(65) Prior Publication Data

US 2023/0115936 A1   Apr. 13, 2023

Related U.S. Application Data

(63) Continuation of application No. 17/498,321, filed on Oct. 11, 2021, now Pat. No. 11,442,524.

(51) Int. Cl.

| | | |
|---|---|---|
| G06F 1/3237 | (2019.01) | |
| H03K 3/037 | (2006.01) | |
| G05F 1/56 | (2006.01) | |
| G11C 5/14 | (2006.01) | |
| H05B 45/30 | (2020.01) | |
| G06F 1/3203 | (2019.01) | |
| H03B 5/02 | (2006.01) | |

(52) U.S. Cl.
CPC .............. *G06F 1/3237* (2013.01); *G05F 1/56* (2013.01); *G06F 1/3203* (2013.01); *G11C 5/147* (2013.01); *H03B 5/02* (2013.01); *H03K 3/037* (2013.01); *H05B 45/30* (2020.01)

(58) Field of Classification Search
CPC ............................ G06F 1/3234; G06F 1/3237
See application file for complete search history.

(56) References Cited

U.S. PATENT DOCUMENTS 7,210,049 B2   4/2007  Disser
8,508,072 B2   8/2013  Hung
(Continued)

FOREIGN PATENT DOCUMENTS

EP         3043624 A1    7/2016

*Primary Examiner* — Patrick O Neill
(74) *Attorney, Agent, or Firm* — Slater Matsil, LLP

(57) ABSTRACT

In an embodiment, an electronic circuit includes: a supply management circuit for receiving an input supply voltage and providing a first supply voltage; and a main circuit configured to: when the input supply voltage becomes higher than a first threshold, cause the electronic circuit to transition into an initialization state in which an oscillator is enabled and configuration data is copied from an NVM to configuration registers, and then to transition into a standby state in which the oscillator is disabled and content of the configuration registers is preserved by the first supply voltage, and, upon reception of a wakeup event, cause the configuration data from the configuration registers to be applied to the first circuit, and cause the electronic circuit to transition into an active state in which the first oscillator is enabled and the first circuit is configured to operate based on the configuration data.

20 Claims, 13 Drawing Sheets

(56) References Cited

U.S. PATENT DOCUMENTS

| | | |
|---|---|---|
| 9,112,721 B2 | 8/2015 | Behrens et al. |
| 9,778,728 B2 | 10/2017 | Dalal et al. |
| 10,491,255 B2 | 11/2019 | Li et al. |
| 11,442,524 B1 * | 9/2022 | Polisi .................... H03K 3/037 |
| 2004/0248624 A1 | 12/2004 | Leclercq |

* cited by examiner

POWER MANAGEMENT CIRCUIT AND METHOD

CROSS-REFERENCE TO RELATED APPLICATIONS

This application is a continuation of U.S. patent application Ser. No. 17/498,321, entitled "POWER MANAGEMENT CIRCUIT AND METHOD," and filed on Oct. 11, 2021, which application is hereby incorporated herein by reference.

TECHNICAL FIELD

The present disclosure relates generally to an electronic system and method, and, in particular embodiments, to a power management circuit and method.

BACKGROUND

Modern integrated circuits (ICs) generally include configuration data stored in non-volatile memory (NVM). For example, a chip manufacturer may store in non-volatile memory data for trimming one or more circuits. For example, a reference voltage of the IC may be designed so that the output voltage is controlled by a one or more bits (e.g., 4 bits). During IC production testing, automated test equipment (ATE) may be search for the 4 bit code that produces a reference voltage that is closest to a target voltage. Such code is then stored in non-volatile memory during the IC production testing. During normal operation, (e.g., upon powerup of the IC) the stored trimmed code is fed to the reference voltage generator so that the reference voltage generator produces a reference voltage that is closest to the target reference voltage. The same trimming approach may be used for other types of blocks, such as for trimming reference currents, oscillators, etc.

Configuration data may include, instead or in addition to trimming data, data for configuring the behavior of the IC. For example, configuration data may include data to set default modes, enable or disable features of the IC, etc.

Configuration data may also include other type of information, such as information to identify a particular IC.

Configuration data may be stored, e.g., in one-time programmable (OTP) memory of the IC.

SUMMARY

In accordance with an embodiment, an electronic circuit includes: a first circuit; a non-volatile memory configured to store configuration data for configuring the first circuit; a first oscillator having an output configured to deliver a first clock signal when the first oscillator is enabled; a supply management circuit configured to receive an input supply voltage at an input of the supply management circuit, and provide a first supply voltage from the input supply voltage at a first output of the supply management circuit; and a main circuit coupled to the output of the first oscillator and including a plurality of configuration registers, the main circuit configured to: when the input supply voltage becomes higher than a first threshold, cause the electronic circuit to transition into an initialization state in which the first oscillator is enabled and the configuration data is copied from the non-volatile memory to the plurality of configuration registers, after the configuration data is copied from the non-volatile memory to the plurality of configuration registers, cause the electronic circuit to transition into a standby state in which the first oscillator is disabled, and content of the plurality of configuration registers is preserved by the first supply voltage, and when the electronic circuit is in the standby state, upon reception of a wakeup event, cause the configuration data from the plurality of configuration registers to be applied to the first circuit, and cause the electronic circuit to transition into an active state in which the first oscillator is enabled and the first circuit is configured to operate based on the configuration data applied from the plurality of configuration registers.

In accordance with an embodiment, an integrated circuit includes: a first circuit; an embedded memory configured to store configuration data for configuring the first circuit; a first oscillator having an output configured to deliver a first clock signal when the first oscillator is enabled; a supply management circuit configured to receive an input supply voltage at an input of the supply management circuit, and provide a first supply voltage from the input supply voltage at a first output of the supply management circuit, where the supply management circuit includes: a pre-regulator configured to generate at an output of the pre-regulator a first voltage from the input supply voltage, and a main voltage regulator configured to generate at an output of the main voltage regulator a second voltage from the input supply voltage when the main voltage regulator is enabled, where the pre-regulator is configured to consume less power than the main voltage regulator, a first comparator configured to assert a first control signal when the first voltage becomes higher than a first threshold, a second comparator configured to assert a second control signal when the second voltage becomes higher than a second threshold, a first switch coupled between the output of the pre-regulator and the output of the supply management circuit, where the first switch is configured to be closed when the second control signal is deasserted and open when the second control signal is asserted, and a second switch coupled between the output of the main voltage regulator and the output of the supply management circuit, where the second switch is configured to be closed when the second control signal is asserted and open when the second control signal is deasserted; a volatile memory coupled to the first circuit; and a main circuit coupled to the output of the first oscillator and to the output of the supply management circuit, the main circuit including a plurality of configuration registers, where the main circuit is configured to: when the first control signal is asserted, cause the integrated circuit to transition into an initialization state in which the first oscillator is enabled and the configuration data is copied from the embedded memory to the plurality of configuration registers, after the configuration data is copied from the embedded non-volatile memory to the plurality of configuration registers, cause the integrated circuit to transition into a standby state in which the first oscillator is disabled, and content of the plurality of configuration registers is preserved by the first voltage, and when the integrated circuit is in the standby state, upon reception of a wakeup event, cause the configuration data from the plurality of configuration registers to be copied to the volatile memory, and cause the integrated circuit to transition into an active state in which the first oscillator is enabled and the first circuit is configured to operate based on the configuration data stored in the volatile memory.

In accordance with an embodiment, a method includes: receiving an input supply voltage with a supply input of an integrated circuit; powering a pre-regulator of the integrated circuit with the input supply voltage; when a pre-regulator output voltage is higher than a predetermined threshold, assert a first control signal; when the first control signal is asserted, cause the integrated circuit to transition into an initialization state in which a first oscillator is enabled and configuration data is copied from an embedded non-volatile memory of the integrated circuit to a plurality of configuration registers of the integrated circuit; after the configuration data is copied from the embedded non-volatile memory to the plurality of configuration registers, causing the integrated circuit to transition into a standby state in which the first oscillator and a main voltage regulator are disabled, and content of the plurality of configuration registers is preserved by the pre-regulator output voltage; and when the integrated circuit is in the standby state, receiving a wakeup event, in response to receiving the wake-up event, applying the configuration data from the plurality of configuration registers to a first circuit of the integrated circuit, and causing the integrated circuit to transition into an active state in which the first oscillator and the main voltage regulator are enabled and the first circuit operates based on the configuration data stored in the plurality of configuration registers.

BRIEF DESCRIPTION OF THE DRAWINGS

[Dow] For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a power management architecture for devices (e.g., LED drivers) configurable via few-times programmable (FTP) memory, e.g., for automotive applications. Some embodiments may be used in non-automotive applications, such as industrial, medical, and consumer applications. Some embodiments may use memories for configuring the device different from FTP, such as OTP. Some embodiments may be used in other types of devices, such as with motor drivers, electronic fuses, etc.

In an embodiment of the present invention, an IC that is configurable based on an embedded memory (e.g., FTP memory) loads, during an initialization state, configurable data from the embedded memory into a plurality of configuration registers. After the loading of the configuration data, the IC transitions into a low power state (e.g., standby state) in which the content of the configuration registers is preserved. Upon reception of a wakeup event, the content of the configuration registers is used to configure one or more circuits of the IC to transition into a normal state. Since the configuration data applied to the one or more circuits of the IC is loaded from the configuration registers and not from the embedded memory, some embodiments advantageously wakeup from the low power state in a fast manner.

Figure 1:
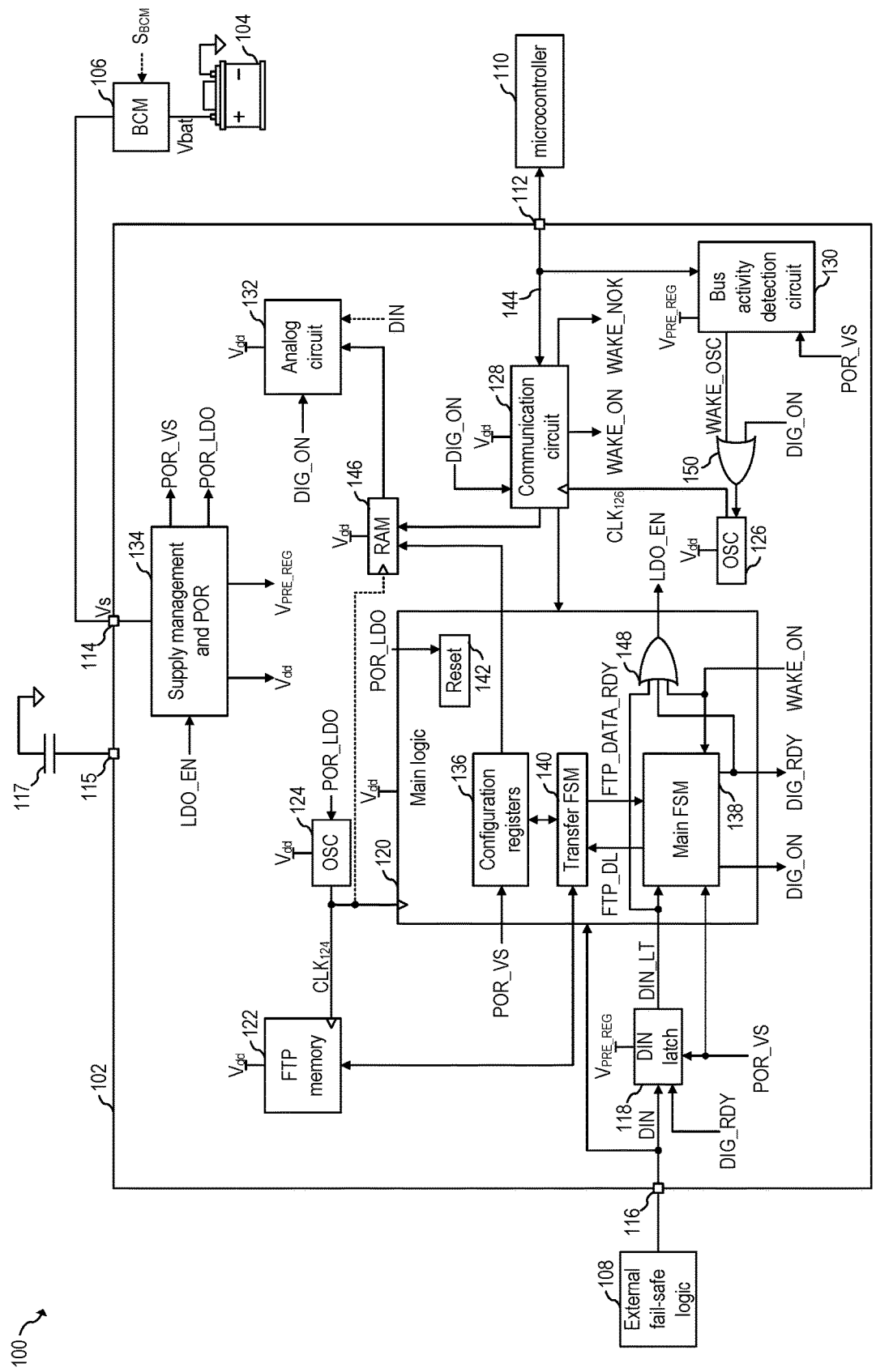
FIG. 1 shows an automotive system including an IC, according to an embodiment of the present invention.

An IC may be configurable via an embedded serial memory (such as an FTP memory), which may include configuration data programmed by the manufacturer (e.g., such as trim and default modes) and/or configuration data programmed by a user (e.g., default modes, etc.). FIG. 1 shows automotive system 100, according to an embodiment of the present invention. Automotive system 100 includes IC 102, car battery 104, local body control module (BCM) 106, external fail-safe logic 108, and microcontroller 110. IC 102 includes input latch 118, main logic circuit 120, FTP memory 122, oscillators 124 and 126, communication circuit 128, bus activity detection circuit 130, analog circuit 132, and supply management and power-on reset (POR) circuit 134.

In some embodiments, analog circuit 132 comprises a light emitting diode (LED) driver for driving one or more LEDs. In some embodiments, analog circuit 132 may include, instead or in addition to a LED driver, other analog circuits, such as a motor driver, an electronic fuse, etc. In some embodiments, analog circuit 132 may include digital circuits.

In some embodiments, microcontroller no is configured to control and/or configure IC 102 via pin(s) or pad(s) 112. Microcontroller 110 may be implemented as a generic or custom processor or controller in any way known in the art. In some embodiments, microcontroller 110 may be omitted.

Figure 2:
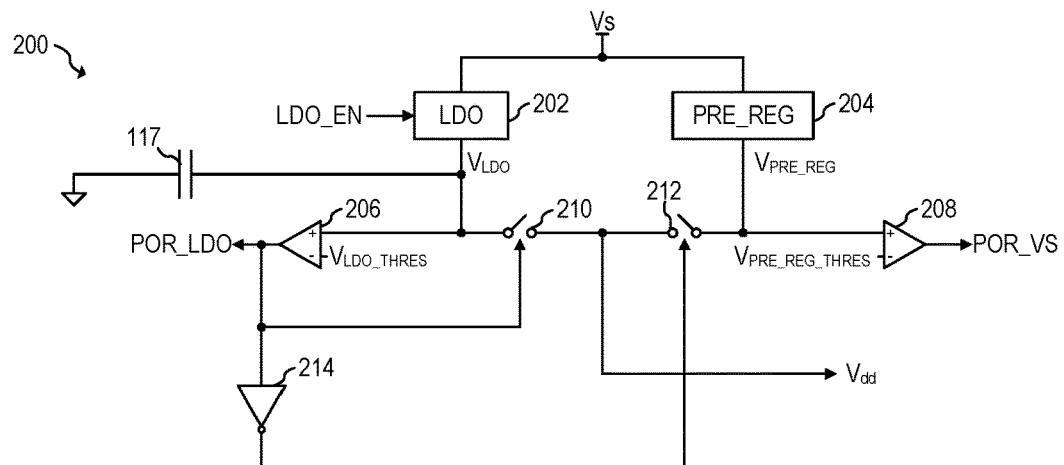
FIG. 2 shows a schematic diagram of the supply management and POR circuit of the IC of FIG. 1, according to an embodiment of the present invention.

Supply management and POR circuit 134 is configured to provide one or more POR signals (e.g., POR_VS, POR_LDO) for activating or deactivating circuits of IC 102, as well as one or more supply voltages (e.g., $V_{dd}$, $V_{PRE\_REG}$) to power one or more circuits of IC 102. For example, in some embodiments, signal POR_VS is asserted (e.g., high) when supply voltage VS becomes higher than a predetermined threshold (e.g., as determined by when the output of pre-regulator 204 becomes higher than $V_{PRE\_REG\_THRES}$, as shown in FIG. 2). Similarly, in some embodiments, signal POR_LDO is asserted (e.g., high) when an output voltage of an internal LDO (e.g., $V_{LDO}$, as shown in FIG. 2) becomes higher than a predetermined threshold (e.g., $V_{LDO\_THRES}$, as shown in FIG. 2). In some embodiments, supply management and POR circuit 134 may be implemented in any way known in the art.

Car battery 104 is configured to provide power (e.g., supply voltage Vs) to pin or pad 114 (e.g., via local BCM 106). Car battery 104 may be implemented in any way known in the art. In some embodiments, pin or pad 114 receives power from a source different than a car battery, such as a phone battery, a voltage regulator powered from mains, etc.

In some embodiments, oscillators 124 and 126 provide respective clock signals to one or more circuits of IC 102. In some embodiments, oscillators 124 and/or 126 are disabled during low-power states (such as standby state) and are activated upon exiting such low-power states. In some embodiments, oscillator 124 generates a 20 MHz clock signal while oscillator 126 generates a 32 MHz clock signals. Other frequencies may also be used. In some embodiments, the clock signals generated by oscillators 124 and 126 may have different frequencies (e.g., 20 MHz and 32 MHz, respectively). In some embodiments, the clock signals generated by oscillators 124 and 126 may have the same frequency. Oscillators 124 and 126 may be implemented in any way known in the art.

In some embodiments, FTP memory 122 is configured to store configuration data programmed by the manufacturer and/or the user, e.g., for configuring analog circuit 132. FTP memory 122 may be implemented in any way known in the art.

In some embodiments, when oscillator 124 is enabled, FTP memory 122 may operate normally. When oscillator 124 is disabled (and, e.g., POR_LDO is deasserted), FTP memory 122 may be in a low-power state (e.g., in which only leakage current is consumed).

In some embodiments, communication circuit 128 is configured to communicate with an external device (e.g., microcontroller 110) via communication bus 144 and pin(s) or pad(s) 112 to receive data (e.g., commands for controlling analog circuit 132 and/or configuration data to be programmed into FTP memory 122), and/or provide data (e.g., status, sensing data from sensors of IC 102, etc.) to the external device. In some embodiments, communication circuit may include a controller area network (CAN) or serial peripheral interface (SPI) interfaces. Other communication interfaces, such as inter-integrated circuit ($I^2C$), may also be used. Communication circuit 128 may be implemented in any way known in the art.

In some embodiments, when oscillator 126 is enabled, communication circuit 128 may operate normally. When oscillator 126 is disabled, communication circuit 128 may be in a low-power state with, e.g., limited functionality.

In some embodiments, external fail-safe logic 108 is configured to wake-up (cause IC 102 to exit standby state) and/or control IC 102 (e.g., analog circuit 132) via pin or pad 116. For example, in some embodiments, external fail-safe logic 108 is configured to wake-up (and control) IC 102 when communication between communication circuit 128 and microcontroller no fails or when microcontroller no malfunctions. For example, external fail-safe logic 108 may receive a command from an electronic control unit (ECU) in a vehicle indicating that microcontroller no is malfunctioning. In response, external fail-safe logic 108 may take control of IC 102 via pin or pad 116. External fail-safe logic 116 may be implemented in any way known in the art, such as with a microcontroller.

In some embodiments, local BCM 106 makes use of a vehicles bus system (e.g., CAN, LIN, etc.) to communication with different ECUs in the vehicle. For example, in some embodiments, local BCM 106 may be controlled based on signal $S_{BCM}$ (e.g., from a main BCM of the vehicle). For example, in some embodiments, signal SBCM may be controlled as a pulse-width modulated (PWM) signal to control a light intensity produced by a LED driver of analog circuit 132. Other control mechanism, such as via the vehicles bus system, may also be used.

Local BCM 106 may operate as a gateway or hub for interacting with other ECUs of the vehicle, thereby advantageously mitigating the need for cabled plug-in connection between ECUs within the vehicle. In some embodiments, local BCM 106 is configured to control, e.g., power delivery to IC 102. In some embodiments, local BCM 106 is configured to wake-up and/or control operation of IC 102 (e.g., analog circuit 132) via terminal 116. In some embodiments, local BCM 106 may be omitted.

In some embodiments, digital input (DIN) latch 118 is configured to receive a request (e.g., a wakeup request to exit standby state) via pin or pad 116 and forward such request to main logic 120 (by asserting signal DIN_LT). As shown in FIG. 1, pin or pad 116 may receive such request from external fail-safe logic 108. In some embodiments, pin or pad 116 may receive such request from other circuits, such as from local BCM 106, and/or microcontroller 110, and/or other external circuits (not shown).

Figure 3:
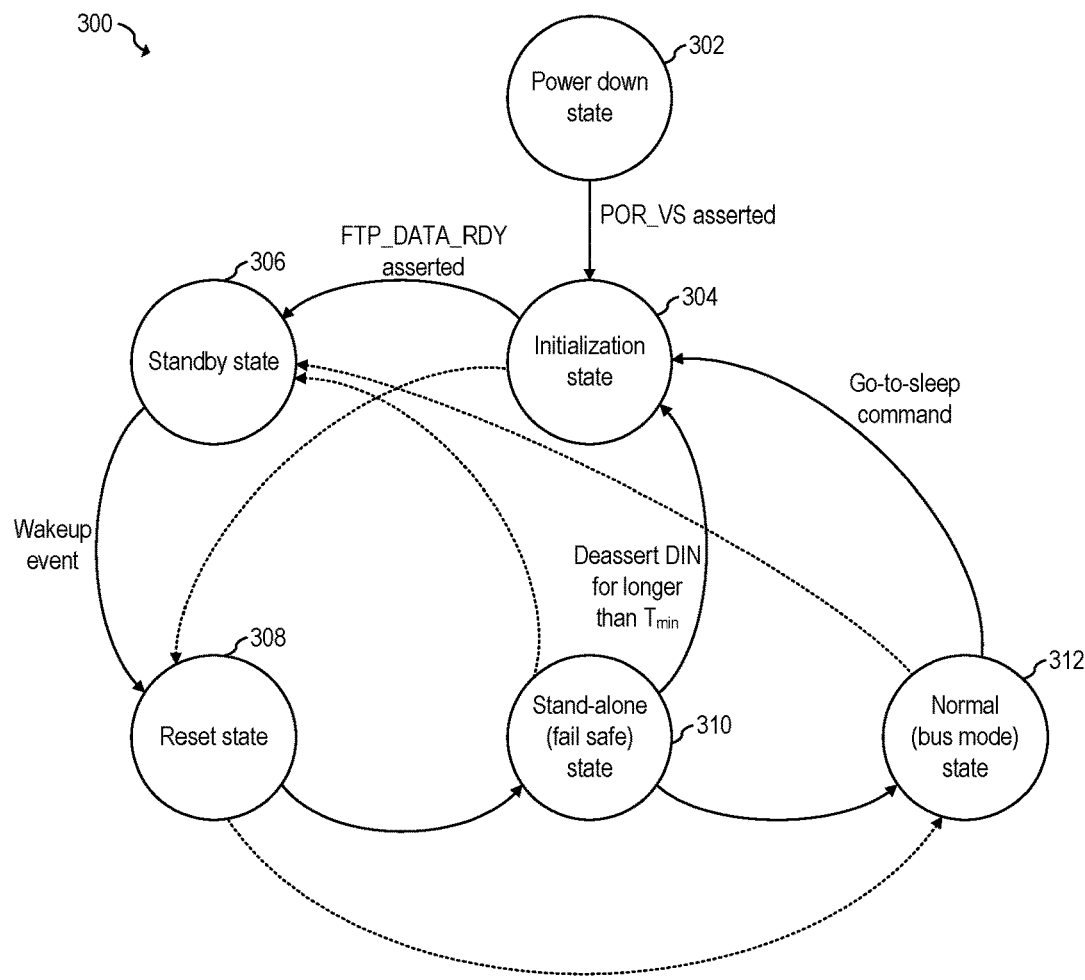
FIG. 3 shows a state diagram of the main FSM of the IC of FIG. 1, according to an embodiment of the present invention.

In some embodiments, input signal DIN may be used to control one or more circuits of IC 102 (e.g., analog circuit 132), e.g., when IC 102 is in a fail-safe state (e.g., 310, as shown in FIG. 3).

Bus activity detection circuit 130 is configured, during a low-power mode (e.g., standby state) to detect activity in the communication bus 144 coupled to pin(s) or pad(s) 112 and enable oscillator 126 upon detection of activity in communication bus 144. In some embodiments, bus activity detection circuit 130 is configured to detect activity in the communication bus 144 by directly monitoring one or more communication lines of the communication bus 144. In some embodiments, bus activity detection circuit 130 is configured to detect activity in the communication bus 144 by monitoring one or more outputs of an analog physical interface configured to decode data from the communication bus 144.

Main logic 120 includes main finite state machine (FSM) 138, transfer FSM 140, reset circuit 142, and a plurality of configuration registers 136. When oscillator 124 is enabled, main logic 120 may operate normally. When oscillator 124 is disabled, main logic 120 may be in a low-power state (e.g., in which only leakage current is consumed).

In some embodiments, main logic 120 also includes OR gates 148, and 150.

Main FSM 138 is configured to control the transitions between power modes (e.g., between standby state and active state). In some embodiments, main FSM is configured to assert/deassert digital control signals (e.g., DIG_ON) for activating/deactivating one or more circuits of IC 102.

Transfer FSM 140 is configured to transfer data from FTP memory 122 (e.g., in response to the assertion of signal FTP_DL) and store them in configuration registers 136.

In some embodiments, configuration registers 136 are reset upon assertion of signal POR_VS. In some embodiments, configuration registers 136 are configured to keep the stored data in the absence of a clock signal (e.g., when oscillator 124 is disabled). In some embodiments, accessing configuration registers 136 is much faster (e.g., 100, 1000, or 10000 times faster or more) than accessing embedded serial FTP memory 122.

In some embodiments, reset circuit 142 is configured to keep logic circuits of IC 102 in a default state when POR_LDO is deasserted. In some embodiments, configuration registers 136, main FSM 138, and communication circuit 128 are not affected/reset by reset circuit 142.

In some embodiments, RAM memory 146 is configured to store the content from configuration registers 136 and to deliver such content to one or more circuits of IC 102 (e.g., to analog circuit 132). In some embodiments, data from configuration registers 136 is transferred to RAM memory 146 by a dedicated circuit of main logic 120 (not shown).

FIG. 2 shows a schematic diagram of supply management and POR circuit 200, according to an embodiment of the present invention. Supply management and POR circuit 200 includes LDO 202, pre-regulator 204, comparators 206 and 208, switches 210 and 212, and inverter 214. Supply management and POR circuit 134 may be implemented as supply management and POR circuit 200.

As shown in FIG. 2, in some embodiments, pre-regulator 204 does not have an enable input and, thus, turn on when supply voltage Vs is applied. When the output voltage $V_{PRE\_REG}$ of pre-regulator 204 becomes higher than a predetermined threshold $V_{PRE\_REG\_THRES}$, signal POR_VS is asserted (e.g., high).

In some embodiments, LDO 202 only turns on when enable signal LDO_EN is asserted (e.g., high). For example, when signal LDO_EN is deasserted (e.g., low), voltage $V_{LDO}$ is low (e.g., 0 V or falls down to 0 V). When signal LDO_EN is asserted, voltage $V_{LDO}$ is high (e.g., 3.3 V or rises up to 3.3 V). When voltage VLDO becomes higher than a predetermined threshold $V_{LDO\_THRES}$, signal POR_LDO is asserted (e.g., high).

As shown in FIG. 2, when LDO 202 is disabled, switch 210 is open and switch 212 is closed, and supply voltage $V_{dd}$ is powered by pre-regulator 204. When LDO 202 is enabled, switch 210 is closed and switch 212 is open, and supply voltage $V_{dd}$ is powered by LDO 202.

In some embodiments, LDO 202 is more accurate and/or is capable of delivering more current, and thus, consumes more power than pre-regulator 204. In some embodiments, the output of LDO 202 is coupled to external capacitor 117 (via pin or pad 115). In some embodiments, LDO 202 is disabled (LDO_EN is deasserted) during low-power mode (e.g., standby state), and supply voltage $V_{dd}$ is provided by pre-regulator 204.

LDO 202 is configured to generate output voltage $V_{LDO}$ when signal LDO_EN is asserted (e.g., high). In some embodiments, voltage $V_{LDO}$ is regulated to 3.3 V when LDO 202 is enabled. Other voltages, such as 1.2 V, 1.8 V, 2.5 V, 5 V, etc., may also be used. LDO 202 may be implemented in any way known in the art.

In some embodiments, pre-regulator 204 is an always-on voltage regulator that lacks an enable input and is configured to generate output voltage $V_{PRE\_REG}$ when supply voltage Vs is applied (and remains generating voltage $V_{PRE\_REG}$ for as long as supply voltage Vs is applied). In some embodiments, the output of pre-regulator 204 is not coupled to an external capacitor. In some embodiments, voltage $V_{PRE\_REG}$ may be 3.3 V. Other voltages, such as 1.2 V, 1.8 V, 2.5 V, 5 V, etc., may also be used. In some embodiments, voltage $V_{PRE\_REG}$ may be equal to voltage $V_{LDO}$ when LDO 202 is enabled. Pre-regulator 204 may be implemented in any way known in the art.

In some embodiments, threshold voltages $V_{LDO\_THRES}$ may be half of voltage $V_{LDO}$ when LDO 202 is enabled. Other values may also be used.

In some embodiments, threshold voltages $V_{PRE\_REG\_THRES}$ may be half of voltage $V_{PRE\_REG}$ when Vs is applied. Other values may be used.

In some embodiments, threshold voltages $V_{LDO\_THRES}$ and $V_{PRE\_REG\_THRES}$ may be equal.

As shown in FIG. 1, in some embodiments, DIN latch 118 and bus activity detection circuit 130 are powered by $V_{PRE\_REG}$. In some embodiments, DIN latch 118 and bus activity detection circuit 130 are powered by $V_{dd}$, since, as illustrated in FIG. 2, $V_{dd}$ remains powered even after LDO 202 is disabled.

FIG. 3 shows state diagram 300 of main FSM 138, according to an embodiment of the present invention. FIG. 3 may be understood in view of FIGS. 1 and 2.

During power down state 302, main FSM 138 is in power down mode (e.g., since supply voltage Vs is low, and thus, voltage $V_{dd}$ is also low). Once supply voltage Vs is applied, signal POR_VS is asserted (e.g., by comparator 208) and main FSM 138 transitions to initialization state 304.

During initialization state 304, signal DIG_RDY is asserted (e.g., high), which causes OR gate 148 to assert signal LDO_EN, which causes LDO 202 to be enabled, which causes signal POR_LDO to be asserted (e.g., high), which causes oscillator 124 to be enabled. Once oscillator 124 is enabled, main FSM 138 asserts signal FTP_DL to cause transfer FSM 140 to transfer configuration data from FTP memory 122 to configuration registers 136. During initialization state 304, signal DIG_ON is deasserted (e.g., low) and oscillator 126 is disabled.

When transfer FSM 140 finishes transferring configuration data from FTP memory 122 to configuration registers 136, transfer FSM 140 asserts signal FTP_DATA_RDY (e.g., high). Upon assertion of signal FTP_DATA_RDY, main FSM 138 transitions to standby state 306.

Upon entering standby state 306, main FSM 138 deasserts signal DIG_RDY, which causes signal LDO_EN to be deasserted, which causes LDO 202 to be disabled. Since LDO 202 is disabled in standby state 306, POR_LDO is deasserted, which causes oscillator 124 to be disabled. Since LDO 202 is disabled, switch 210 is opened and switch 212 is closed so that pre-regulator 204 provides supply voltage $V_{dd}$.

Since main logic 120 continues to receive power in standby state 306 (supply voltage $V_{dd}$ provided by pre-regulator 204), some embodiments advantageously preserve the content of configuration registers 136 in standby stage 306 while achieving low power consumption. As will be described in more detail later, preserving the content of configuration registers 136 during standby state 306 advantageously allows for waking up IC 202 to an operational state (e.g., 310, 312) in a fast manner, since the step of reading FTP memory 122 to load RAM memory 146 with configuration data may be omitted.

In some embodiments, IC 102 includes a plurality of oscillators, and all oscillators of IC 102 are disabled during standby state 306. As will be described in more detail later, in some embodiments, all oscillators of IC 102 are disabled during standby state 306 except that oscillator 126 (for providing a clock signal to communication circuit 128) may be temporarily enabled upon detection of activity in communication bus 144, e.g., for processing a wake-up sequence from communication bus 144.

Upon a wakeup event, main FSM 138 transitions to reset state 308. In some embodiments, reset state 308 is a transition state in which RAM memory 146 is loaded with the configuration data from configuration registers 136. In some embodiments, RAM memory 146 is loaded based on clock signal $CLK_{124}$, and thus, in some embodiments, RAM memory 146 is loaded after POR_LDO is asserted and oscillator 124 is enabled.

In some embodiments, asserting signal DIN (e.g., from low to high) causes signal DIN_LT to transition from low to high, which causes a wake-up event. In some embodiments, receiving a valid command over communication bus 144 causes communication circuit 128 to assert signal WAKE_ON, which causes a wakeup event. In some embodiments, other wake-up events may also be possible.

In some embodiments, once RAM memory 146 is loaded with the configuration data from configuration registers 136, main FSM 138 transitions to stand-alone (e.g., fail safe) state 310. The stand-alone state 310 is an active state in which IC 102 is capable of operating without intervention from microcontroller no by relying on the configuration data originating from FTP memory 122. During stand-alone state 310, DIG_RDY, DIG_ON, LDO_EN, and POR_LDO signals are asserted (e.g., high), and LDO 202, and oscillators 124 and 126 are enabled.

In some embodiments, if the wakeup event causing the exiting of standby state is the assertion of signal DIN_LT, then main FSM 138 remains in the stand-alone state 310 until signal DIN is deasserted for a period longer than a minimum period $T_{min}$. When signal DIN is deasserted for a period longer than the minimum period $T_{min}$, main logic 120 detects such event and main FSM 138 transitions back to initialization state 304 (and then transitions quickly to standby state 306, as described before).

By transitioning from stand-alone state 310 to initialization state 304 before reaching standby state 306, some embodiments advantageously reload the content of FTP memory 122 into configuration registers 136 (which may advantageously prevent data of configuration registers 136 from being corrupted) while still achieving a fast wakeup (from standby state 306) upon a wakeup event.

In some embodiments, upon deassertion of signal DIN for a period longer than $T_{min}$, main FSM 138 transitions directly from stand-alone state 310 to standby state 306 (skipping initialization state 304).

In some embodiments, the minimum period $T_{min}$ may be 15 ms. Other minimum periods, such as higher than 15 ms (e.g., 25 ms, 50 ms, or higher), or lower than 15 ms (e.g., 10 ms, 8 ms, or lower), may also be used.

In embodiments using input signal DIN for controlling one or more circuits of IC 102, signal DIN may be kept low for periods shorter than $T_{min}$ to avoid triggering a transition to standby state 306. For example, in embodiments controlling a LED driver of analog circuit 132 by modulating signal DIN as a PWM signal, the frequency of such PWM signal may be kept higher than $$\frac{1}{T_{min}}.$$

In some embodiments, if the wakeup event causing the exiting of standby state is the assertion of signal WAKE_ON, then stand-alone state 310 operates as a transition state and main FSM 138 transitions (e.g., immediately) to normal state 312. In some embodiments, when the wakeup event causing the exiting of standby state is the assertion of signal WAKE_ON, the stand-alone state 310 is skipped, and main FSM 138 transitions (e.g., directly) from the reset state 308 to normal state 312. The normal state 312 is an active state in which IC 102 is capable of operating based on commands received from microcontroller no. During normal state 312, DIG_RDY, DIG_ON, LDO_EN, and POR_LDO signals are asserted (e.g., high), and LDO 202, and oscillators 124 and 126 are enabled.

During normal state 312, microcontroller no controls the operation of IC 102 (e.g., of analog circuit 132), e.g., by causing the programming of RAM memory 146 via communication circuit 128. Upon reception (by communication circuit 128) of a go-to-sleep command from microcontroller no, main FSM 138 transitions back to initialization state 304 (and then transitions quickly to standby state 306, as described before). In some embodiments, upon reception of the go-to-sleep command, main FSM 138 transitions directly to from normal state 312 to standby state 306 (skipping initialization state 304).

In some embodiments, main FSM 138 may transition from stand-alone state 310 to normal state 312 upon reception of a valid command from communication bus 144. In some embodiments, main FSM 138 may transition from normal state 312 to stand-alone state 310, e.g., is microcontroller no does not refresh a watchdog register of main logic 120.

In some embodiments, such as in some embodiments in which input signal DIN is pulled up during power up (e.g., by local BCM 106), main FSM 138 may transition from initialization state 304 to reset state 308 directly or standby state 306 may operate as a transition state.

In some embodiments, reading data from FTP memory 122 may take a considerable amount of time (e.g., hundreds of µs). As illustrated in FIGS. 1-3, some embodiments are advantageously capable of waking up in a fast manner in response to a wakeup event by loading the configuration data from configuration registers 136 and avoiding the reading of FTP memory 122 during wakeup (while transitioning out of standby state 306).

Advantages of some embodiments include the capability of an IC that is configurable by an embedded memory for being in a low power consumption state (e.g., standby) while being capable of waking up in a fast manner upon reception of a wakeup event. Since FTP memory 122 may be programmable by a user (e.g., by microcontroller no), some embodiments advantageously provide flexibility in the configuration of IC 102 while retaining the advantages of low power consumption and fast wakeup times.

Figure 4:
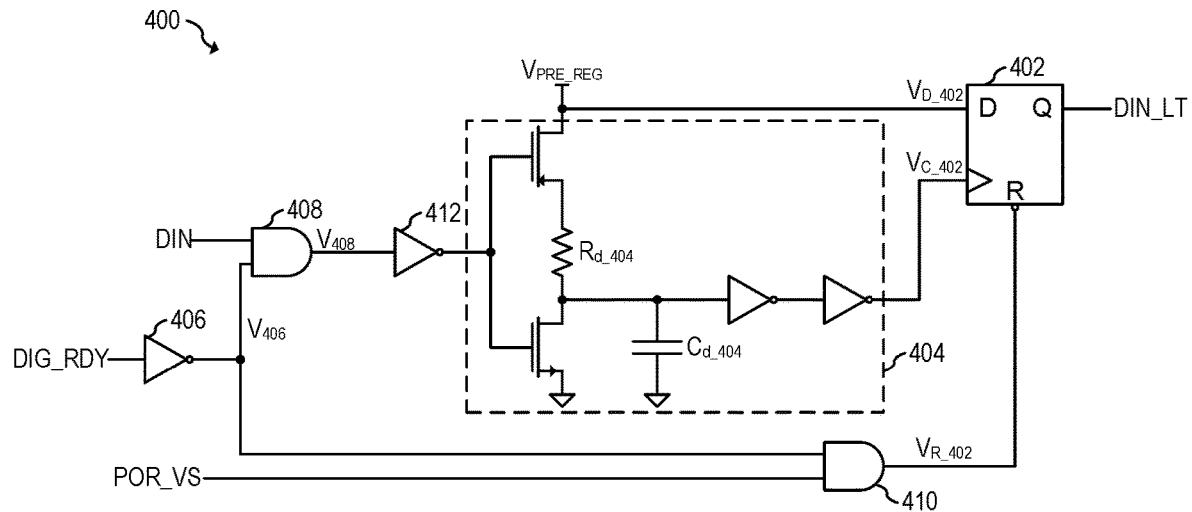
FIG. 4 shows a schematic diagram of the input latch of FIG. 1, according to an embodiment of the present invention.

FIG. 4 shows a schematic diagram of input latch 400, according to an embodiment of the present invention. Input latch 400 includes flip-flop 402, delay circuit 404, inverters 406 and 412, and AND gates 408 and 410. Input latch 118 may be implemented as input latch 400.

Upon entering standby state, signal DIG_RDY is deasserted (low), causing signal $V_{R\_402}$ to be low, and thus, causing flip-flop 402 to reset, thereby causing signal DIN_LT to be deasserted (low). After entering standby state, signal $V_{406}$ is high (since signal DIG_RDY is low), and signal $V_{R\_402}$ is high (since signal POR_VS is high).

During standby state, the assertion of input signal DIN causes signal $V_{408}$ to transition from low to high. A delay time after signal $V_{408}$ transitions from low to high, signal $V_{C\_402}$ transitions from low to high, which causes flip-flop 402 to assert signal DIN_LT (high). The assertion of signal DIN_LT causes main FSM 138 to transition out of standby state 306, which causes signal DIG_RDY to transition from low to high, causing signal $V_{406}$ to transition from high to low, and thus causing signal $V_{R\_402}$ to transition from high to low, thereby resetting flip-flop 402 and causing signal DIN_LT to be deasserted (low). By deasserting signal DIN_LT after exiting standby state 306, some embodiments advantageously allow main FSM 138 to enter standby state 306 again.

As shown in FIG. 4, elements 402, 404, 408 and 412 operate as a rising edge or pulse detector for signal DIN. In some embodiments, the pulse detector detect only pulses having a duration greater than a minimum duration.

In some embodiments, delay circuit 404 may be implemented, e.g., as shown in FIG. 4, where the delay time is set based on $R_{d\_404} \cdot C_{d\_404}$. Other implementations, such as other analog delay circuit implementations, are also possible. In some embodiments, the delay time given by delay circuit 404 may be between 5 μs and 20 μs. Other delay times, such as longer than 20 μs (e.g., 25 μs, 50 μs, or more), or shorter than 5 μs (e.g., 4 μs, 3 μs, or less) may also be used.

Figure 5:
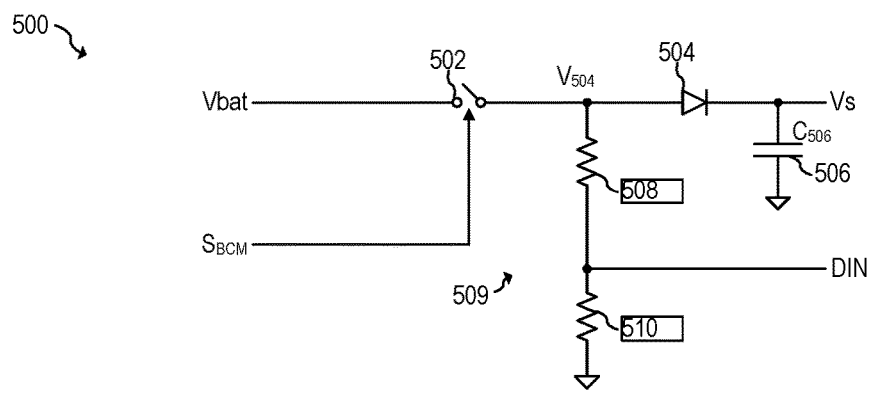
FIG. 5 shows a schematic diagram of the local BCM of FIG. 1, according to an embodiment of the present invention.

FIG. 5 shows a schematic diagram of local BCM 500, according to an embodiment of the present invention. Local BMC 500 includes switch 502, diode 504, tank capacitor 506, and resistors 508 and 510. Local BCM 106 may be implemented as local BMC 500.

As can be seen in FIG. 5, local BCM 106 may connect/disconnect battery 104 to/from pin or pad 114 by closing/opening switch 502, e.g., in response to a command from a main BCM of the vehicle (now shown).

In some embodiments, as shown in FIG. 5, switch 502 may also be connected to pin or pad 116 via voltage divider 509 (which includes resistors 508 and 510). In some such embodiments, signal DIN is asserted upon application of supply voltage Vs (when switch 502 is closed), and standby state 306 becomes a transitory state (since signal DIN is asserted during powerup, thereby causing a wakeup event upon entering standby state 306).

In some embodiments, signal $S_{BCM}$ may be used to control one or more circuits of IC 102. For example, in an embodiment in which analog circuit 132 is implemented as a LED driver, signal DIN may be driven in a PWM manner to control the intensity of light produced by the LEDs driver by such LED driver. Such PWM modulation may be achieved by modulating signal SBCM is a PWM manner. In some embodiments, the frequency of the PWM signal of signal SBCM is kept higher than a predetermined frequency such that tank capacitor 506 keeps voltage 506 higher than a predetermined voltage to keep IC 102 powered and to avoid keeping signal DIN low for a period longer than $T_{min}$. For example, in an embodiment, voltage Vs is 12 V, capacitance $C_{506}$ is 10 μF, $T_{min}$ is 15 ms and the PWM frequency is between 100 Hz and 2 kHz. Other values may also be used.

In some embodiments, resistors 508 and 510 may be omitted.

Figure 6:
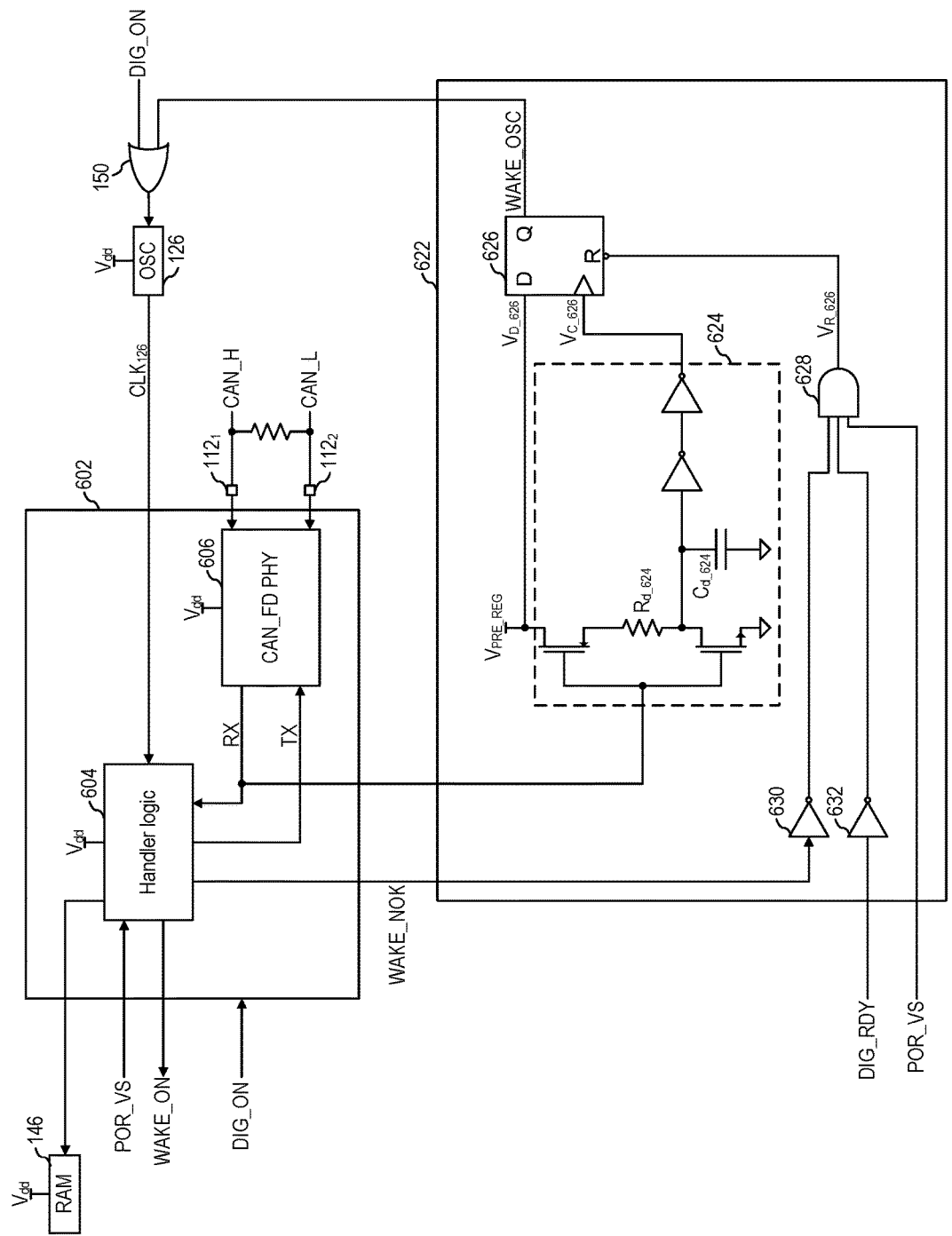
FIG. 6 shows a schematic diagram illustrating the communication circuit and bus activity detection circuit of FIG. 1, according to an embodiment of the present invention.

FIG. 6 shows a schematic diagram illustrating communication circuit 602 and bus activity detection circuit 622, according to an embodiment of the present invention. Communication circuit includes physical layer 606 and handler logic 604. Bus activity detection circuit 622 includes flip-flop 626, delay circuit 624, AND gate 628, and inverters 63o and 632. Communication circuit 128 may be implemented as communication circuit 602. Bus activity detection circuit 130 may be implemented as bus activity detection circuit 604.

Upon entering standby state 306, signal POR_VS is asserted (e.g., high), and signals DIG_RDY, DIG_ON, WAKE_NOK and WAKE_OSC are deasserted (e.g., low). Thus, during standby state 306, oscillator 126 is disabled, and thus, handler logic 604 is in a low power state (e.g., consuming only leakage current).

During standby state 306, physical layer 606 is powered and operational with reduced functionality and bus activity detection circuit 622 is powered and operational, where elements 624 and 626 operate as a falling edge or pulse detector for signal RX. A time after detection of a falling edge of signal RX (where the time is given by delay circuit 624), signal $V_{C\_626}$ transitions from low to high, thus causing signal WAKE_OSC transition from low to high, thereby turning on oscillator 126. Upon activation of oscillator 126, handler logic 604 begins receiving clock signal $CLK_{126}$ and begins processing signal RX.

When handler logic 604 determines that the data received from signal RX is compliant with a wake-up sequence, handler logic 604 asserts (e.g., high) signal WAKE_ON, which causes main FSM 138 to exit standby state 306 and enter into an active state (e.g., 310, 312) in which signals DIG_RDY and DIG_ON are asserted (e.g., high). The assertion of DIG_RDY causes flip-flop 626 to reset, which causes signal WAKE_OSC to deassert (low). Since signal DIG_ON is high, oscillator 126 continues to be enabled upon the deassertion of signal WAKE_OSC.

When handler logic 604 determines that the data received from signal RX is not compliant with the wake-up sequence, handler logic 604 asserts (e.g., high) signal WAKE_NOK, which causes flip-flop 626 to reset, which causes signal WAKE_OSC to deassert (low), thus causing the turning off of oscillator 126.

As illustrated by FIG. 6, some embodiments are advantageously capable of being responsive to communications from the communication bus 144 (e.g., by activating the oscillator 126 upon detection of bus activity) while keeping power consumption low when in a low power state (e.g., standby state), e.g., by keeping oscillator 126 off except for when bus (144) activity is detected.

In some embodiments, physical layer 606 is an analog circuit that operates as an interface between the analog domain (e.g., communication bus 144) and the digital domain (e.g., handler logic 604). For example, as shown in FIG. 6, physical layer 606 may be implemented as a CAN flexible data-rate (CAN FD) physical layer that delivers signal RX (e.g., arranged in one or more frames) based on differential signals CAN_H and CAN_L to handler logic 604 and delivers differential signals CAN_H and CAN_L to communication bus 144 based on signal TX.

In some embodiments, physical layer 606 may be implemented in accordance with other communication protocols, such as SPI and I²C.

In some embodiments, handler logic 604 is configured to decode data frames from signal RX and configure one or more circuits of IC 102 (e.g., RAM 146) based on the decoded data frames. Handler logic is also configured to generate digital signals (e.g., WAKE_ON, WAKE_NOK) to cause wakeup events and/or be responsive to commands received from communication bus 144 while in standby state 306. In some embodiments, handler logic is implemented with digital circuits operating based on clock signal $CLK_{126}$. Other implementations are also possible.

In some embodiments, delay circuit 624 may be implemented, e.g., as shown in FIG. 6, where the delay time is set based on $R_{d\_624} C_{d\_624}$. Other implementations, such as other analog delay circuit implementations, are also possible. In some embodiments, the delay time given by delay circuit 624 may be between 5 µs and 20 µs. Other delay times, such as longer than 20 µs (e.g., 25 µs, 50 µs, or more), or shorter than 5 µs (e.g., 4 µs, 3 µs, or less) may also be used.

Figure 7:
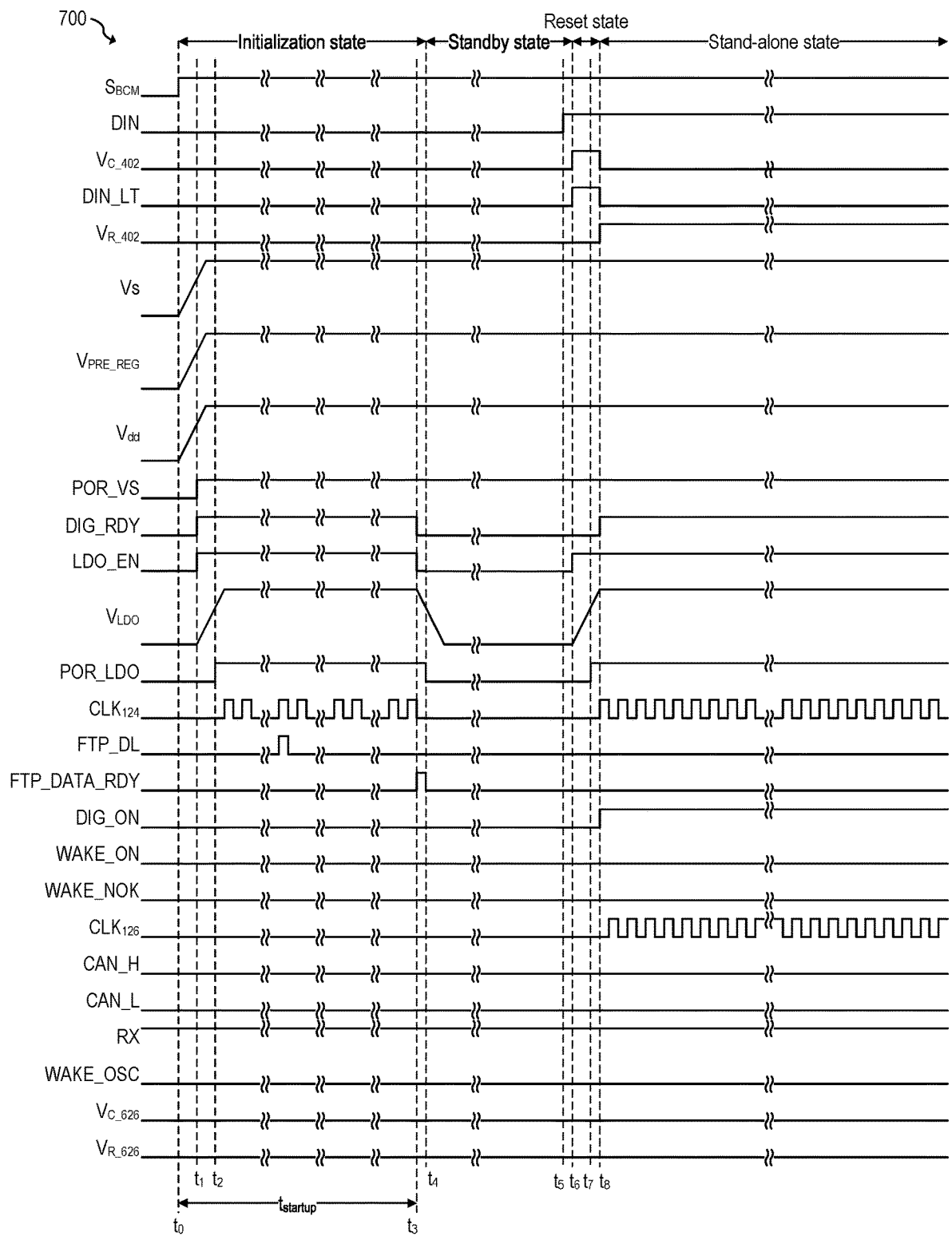
FIGS. 7-13 show waveforms associated with the IC of FIG. 1, according to embodiments of the present invention.

FIG. 7 shows waveforms 700 associated with IC 102, according to an embodiment of the present invention. Waveforms 700 are associated with IC 102 with pin or pad 114 coupled to local BCM 106 implemented with local BCM 500 without having node $V_{504}$ coupled to DIN (e.g., without resistors 508 and 510), and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 700 illustrate the transition from power down state 302 to initialization state 304, and then to standby state 306, as well as waking up from standby state 306 based on the assertion of signal DIN.

As shown in FIG. 7, when signal $S_{BCM}$ is asserted (thus closing switch 502) at time $t_0$, voltage $V_S$, $V_{PRE\_REG}$ and $V_{dd}$ begin to increase (since switch 210 is open and switch 212 is closed so that supply voltage $V_{dd}$ is provided by pre-regulator 204), and main FSM 138 transitions into initialization state 304. When voltage $V_{PRE\_REG}$ reaches threshold voltage $V_{PRE\_REG\_THRES}$ at time $t_1$, signal POR_VS is asserted, which causes main FSM 138 to assert signal DIG_RDY, which causes OR gate 148 to assert signal LDO_EN which turns on LDO 202, which causes voltage $V_{LDO}$ to begin increasing. When voltage $V_{LDO}$ reaches threshold voltage $V_{LDO\_THRES}$ at time $t_2$, signal POR_LDO is asserted, which causes oscillator 124 to turn on, and causes switch 212 to open and switch 210 to close so that supply voltage $V_{dd}$ is provided by LDO 202.

A time after clock signal $CLK_{124}$ begins oscillating, main FSM 138 asserts signal FTP_DL to cause transfer FSM 140 to begin transferring data from FTP memory 122 to configuration registers 136. When transfer FSM 140 finishes transferring data from FTP memory 122 to configuration registers 136, transfer FSM 140 asserts signal FTP_DATA_RDY, which causes main FSM 138 to begin transitioning into standby state 306 by deasserting signal DIG_RDY at time $t_3$, which causes signal LDO_EN to deassert, which turns off LDO 202 and causes voltage $V_{LDO}$ to begin decreasing. When voltage $V_{LDO}$ decreases below $V_{LDO\_THRES}$ at time $t_4$, signal POR_LDO is deasserted, which causes oscillator 124 to turn off. Main FSM 138 enters standby state 306 at time $t_4$.

In some embodiments, IC 102 may stay in standby state 306 for a substantial amount of time, which may range between a few seconds to a few minutes or more.

When input signal DIN is asserted at time $t_5$, DIN latch 118 asserts signal DIN_LT at time $t_0$. In some embodiments, the time duration between time $t_5$ and $t_0$ is based on the delay time of delay circuit 404, which may be, e.g., 10 µs. Other delay times may also be used.

The assertion of signal DIN_LT causes OR gate 148 to assert LDO_EN, which turns on LDO 202. When voltage $V_{LDO}$ reaches threshold voltage $V_{LDO\_THRES}$ at time $t_7$, signal POR_LDO is asserted, which causes oscillator 124 to turn on, and causes switch 212 to open and switch 210 to close so that supply voltage $V_{dd}$ is provided by LDO 202. When clock 124 begins oscillating at time $t_8$, main FSM 138 asserts signals DIG_RDY and DIG_ON, which causes oscillator 126 to turn on and causes DIN latch 400 to deassert signal DIN_LT. In some embodiments, reset state 308 spans between time $t_6$ and time $t_8$, and RAM 146 is loaded with the content of configuration registers 136 between times $t_6$ and $t_8$. In some embodiments, main FSM 138 transitions into stand-alone state at time $t_8$.

Although not shown in FIG. 7, in some embodiments, clock signal $CLK_{124}$ begins pulsing during the reset state 308 (e.g., to allow for the transfer of data from configuration registers 136 to RAM memory 146).

In some embodiments, the duration of reset state 308 last until after a few clock cycles of clock signal $CLK_{124}$. For example, in some embodiments, signal DIG_ON is asserted a few clock cycles of clock signal $CLK_{124}$ after POR_LDO is asserted, where reset state 308 spans until signal DIG_ON is asserted, and stand-alone state begins when signal DIG_ON is asserted.

Figure 8:
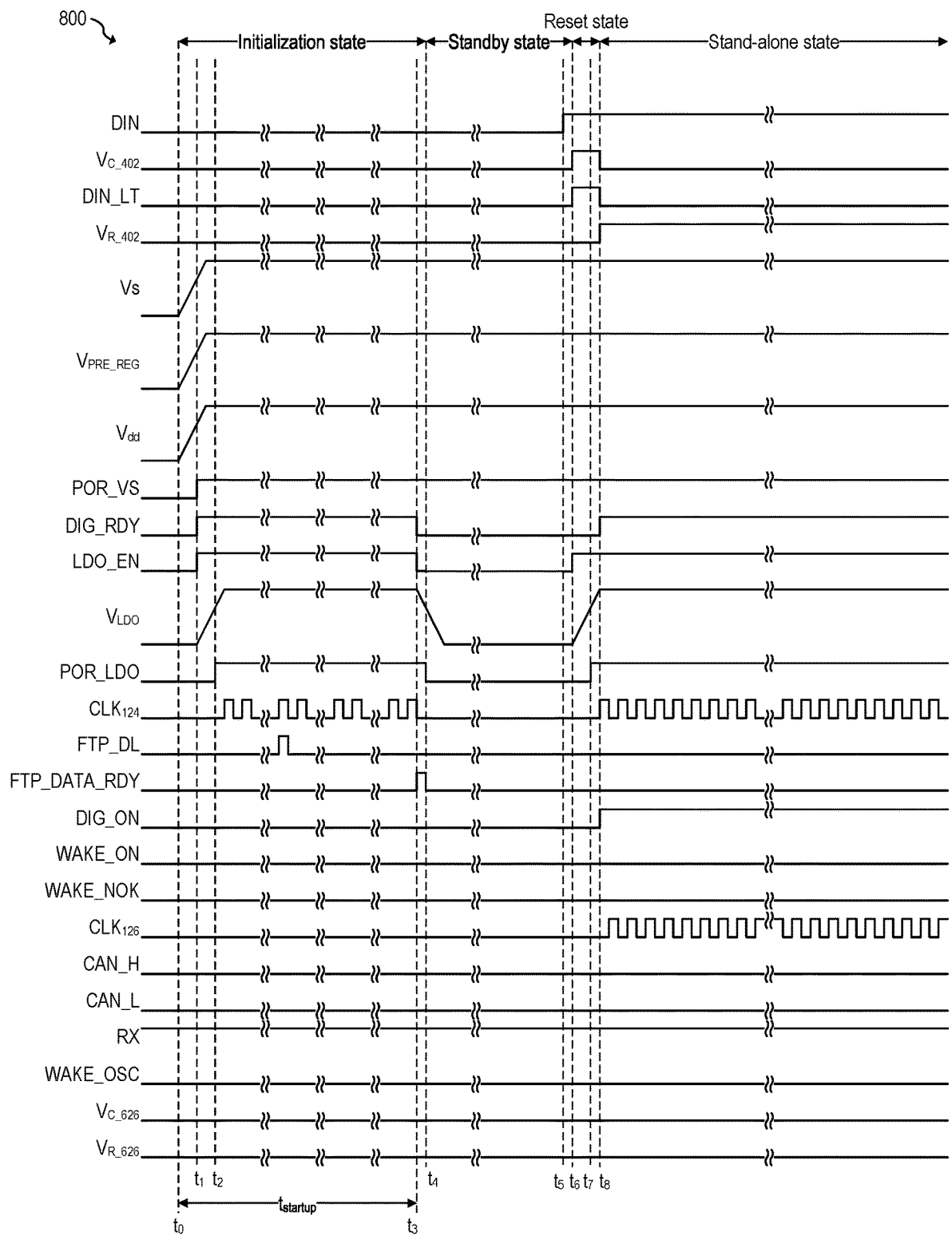

In some embodiments, such as in embodiments that do not implement local BCM 106, applying a voltage supply to Vs at time $t_0$ (e.g., by using a closing a switch, physically connecting a battery, or turning on a voltage regulator coupled to pin or pad 114) may result in waveforms that are otherwise similar or identical to waveforms 700. For example, FIG. 8 shows waveforms 800 associated with IC 102, according to an embodiment of the present invention. Waveforms 800 are associated with IC 102 without local BCM 106, with pin or pad 116 coupled to external fail-safe logic 108, and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 800 illustrate the transition from power down state 302 to initialization state 304 caused by connecting pin or pad 114 to battery 104 at time $t_0$, and then the transition to standby state 306, as well as waking up from standby state 306 based on the assertion of signal DIN by external fail-safe logic 108.

Although not shown in FIG. 8, in some embodiments, clock signal $CLK_{124}$ begins pulsing during the reset state 308 (e.g., to allow for the transfer of data from configuration registers 136 to RAM memory 146).

Figure 9:
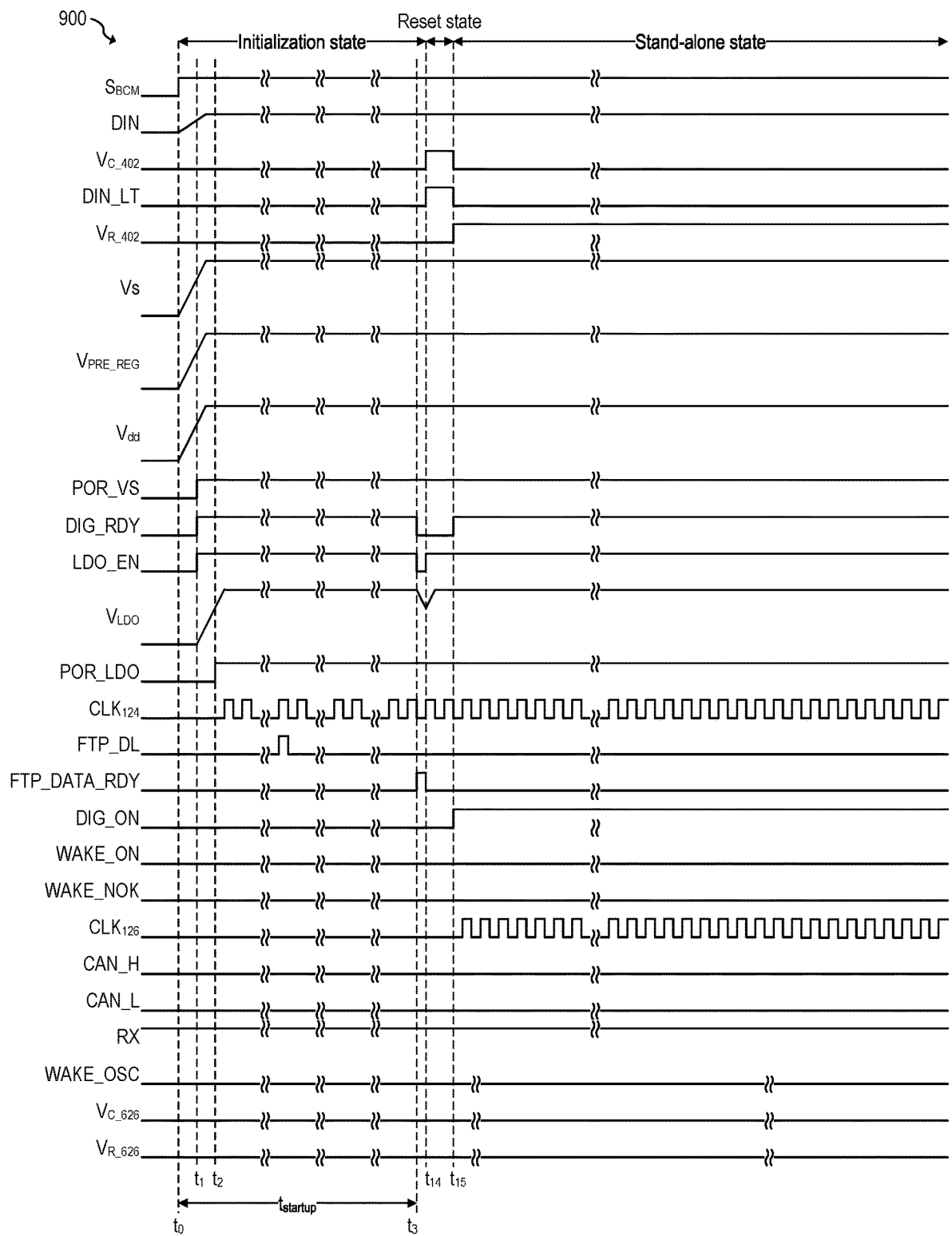

FIG. 9 shows waveforms 900 associated with IC 102, according to an embodiment of the present invention. Waveforms 900 are associated with IC 102 with local BCM 106 implemented as local BCM 500, with pin or pad 116 coupled to voltage divider 509 of local BCM 500 (as shown in FIG. 5), and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 800 illustrate the transition from power down state 302 to stand-alone state 310 when signal DIN is pulled up during power-up.

As shown in FIG. 9, upon assertion of signal $S_{BCM}$, signal DIN is pulled up by voltage divider 509. Waveforms 900 are otherwise similar or identical to waveforms 700 between time $t_0$ and $t_3$.

Since input signal DIN is asserted during powerup (e.g., before time $t_2$), signal DIN_LT is asserted (at time $t_{14}$) a delay time after signal DIG_RDY is deasserted, where the delay time is given by delay circuit 404. Upon assertion of signal DIN_LT (at time $t_{14}$) signal LDO_EN is asserted. As shown in FIG. 9, signal LDO_EN may be asserted before POR_LDO is deasserted. In some embodiments, signal LDO_EN is kept asserted (e.g., high) between time $t_3$ and $t_{14}$ by a falling edge filter (e.g., a deglitch filter) applied to DIG_RDY signal (e.g., at the input of OR gate 148).

As shown in FIG. 9, since signal POR_LDO is not deasserted, oscillator 124 remains on at time $t_{14}$. At time $t_{15}$, main FSM 138 asserts signals DIG_RDY and DIG_ON, which causes oscillator 126 to turn on and causes DIN latch 400 to deassert signal DIN_LT. In some embodiments, reset state 308 spans between time $t_{14}$ and time $t_{15}$, and RAM 146 is loaded with the content of configuration registers 136 between times $t_{14}$ and $t_{15}$. In some embodiments, main FSM 138 transitions into stand-alone state 310 at time $t_{15}$.

In some embodiments, signal DIG_ON is asserted a few clock cycles of clock signal $CLK_{124}$ after signal DIG_RDY is asserted, where reset state 308 spans until signal DIG_ON is asserted, and stand-alone state begins when signal DIG_ON is asserted.

As shown in FIG. 9, in some embodiments, standby state 306 may be skipped when input signal DIN is asserted during powerup (e.g., before time $t_2$), and main FSM 138 may transition directly from initialization state 304 to reset state 308.

Figure 10:
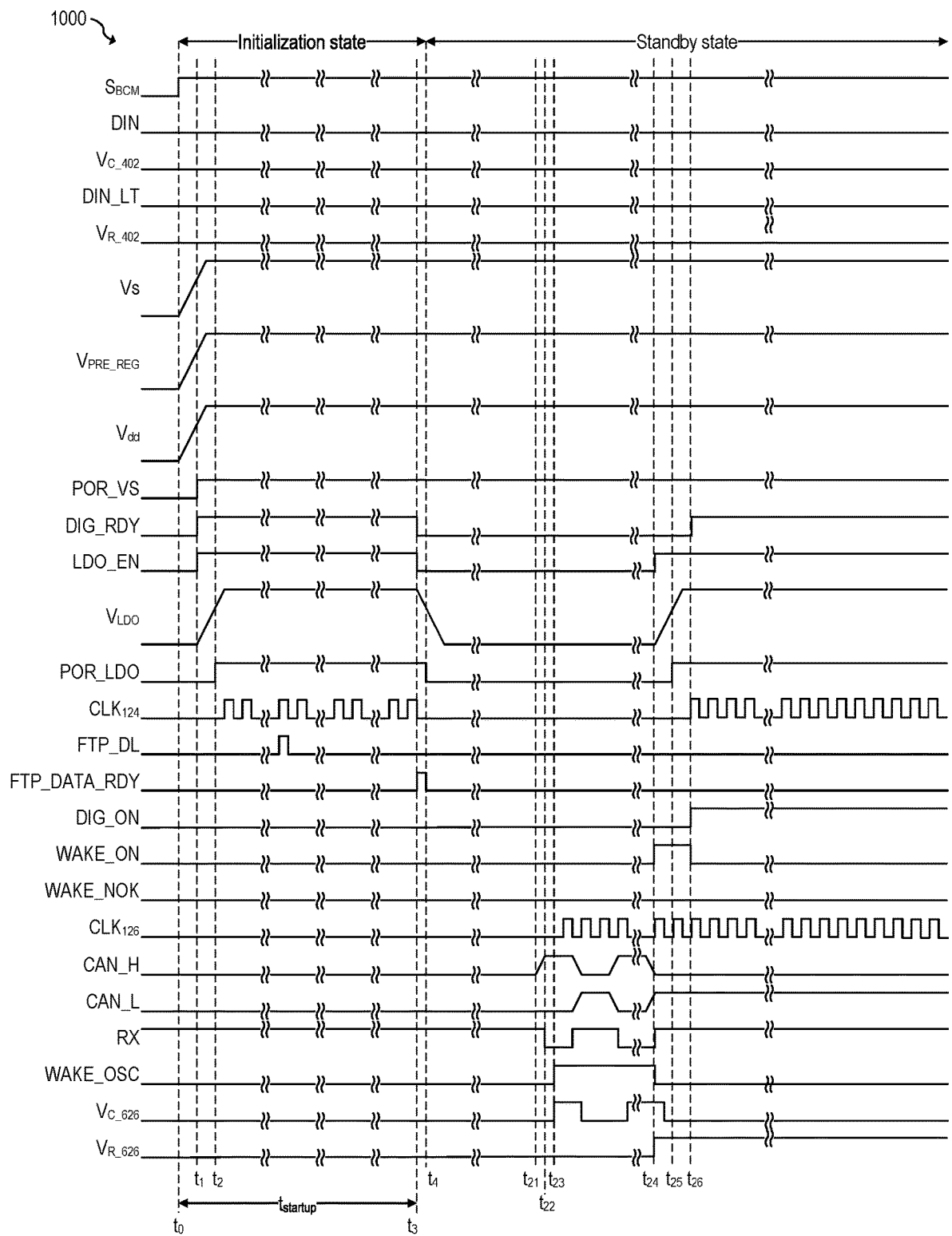

FIG. 10 shows waveforms 1000 associated with IC 102, according to an embodiment of the present invention. Waveforms 1000 are associated with IC 102 with pin or pad 114 coupled to local BCM 106 implemented with local BCM 500 without having node $V_{504}$ coupled to DIN (e.g., without resistors 508 and 510), and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 1000 illustrate the transition from power down state 302 to initialization state 304, and then to standby state 306, as well as waking up from standby state 306 based on a CAN wakeup from communication bus 144.

Waveforms 1000 may be similar or identical to waveforms 700 between time $t_0$ and time $t_4$. At time $t_{21}$, activity in communication bus 144 causes signal RX to transition from high to low at time $t_{22}$, which causes signals $V_{C\_626}$ and WAKE_OSC to be asserted at time $t_{23}$, where the time between $t_{22}$ and $t_{23}$ may be set by delay circuit 624.

Upon assertion of signal WAKE_OSC at time $t_{23}$, oscillator 126 is enabled and handler logic 604 begins decoding data from signa RX. If handler logic 604 determines at time $t_{24}$ that the frame demodulation of signal RX matches the wakeup sequence, then signal WAKE_ON is asserted at time $t_{24}$, which causes signal LDO_EN to be asserted at time $t_{24}$, which causes POR_LDO to be enabled at time $t_{25}$ (when $V_{LDO}$ reaches threshold voltage $V_{LDO\_THRES}$), which causes oscillator 124 to be enabled at time $t_{26}$, and causes main FSM 138 to exit standby state 306.

At time $t_{26}$, signals DIG_ON and DIG_RDY are asserted, which cause signal WAKE_OSC to be deasserted at time $t_{26}$. As illustrated in FIGS. 6 and 10, oscillator 126 remains enabled at time $t_{26}$ despite signal WAKE_OSC being deasserted since signal DIG_ON is asserted.

In some embodiments, reset state 308 spans between time $t_{24}$ and time $t_{26}$, and RAM 146 is loaded with the content of configuration registers 136 between times $t_{24}$ and $t_{26}$. In some embodiments, main FSM 138 transitions into normal state 312 at time $t_{26}$.

Figure 11:
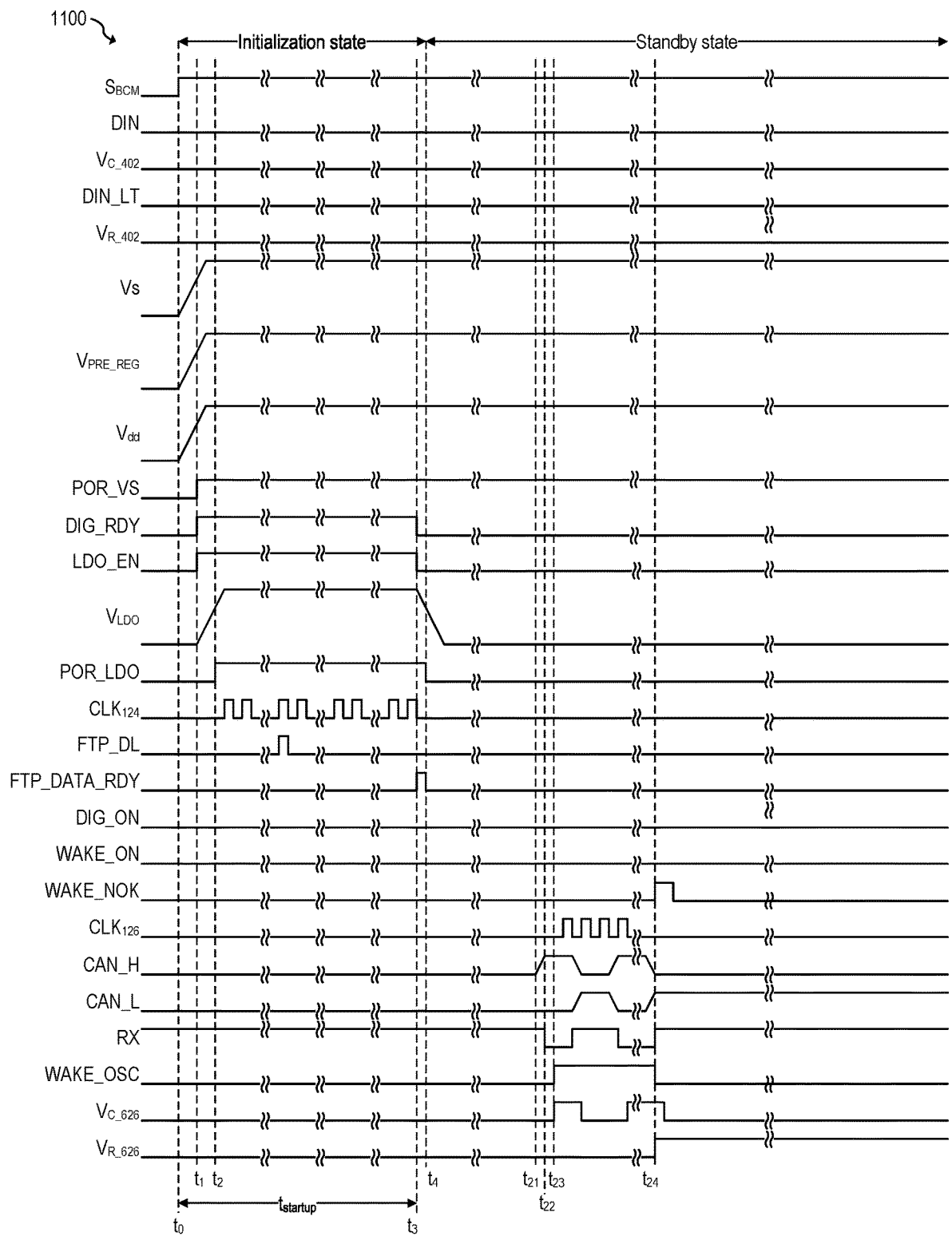

FIG. 11 shows waveforms 1100 associated with IC 102, according to an embodiment of the present invention. Waveforms 1100 are associated with IC 102 with pin or pad 114 coupled to local BCM 106 implemented with local BCM 500 without having node $V_{504}$ coupled to DIN (e.g., without resistors 508 and 510), and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 1100 illustrate the transition from power down state 302 to initialization state 304, and then to standby state 306, as well as waveforms associated with the reception of a non-compliant CAN wakeup sequence from communication bus 144.

Waveforms 1100 may be similar or identical to waveforms 1000 between time $t_0$ and time $t_{24}$. If handler logic 604 determines at time $t_{24}$ that the frame demodulation of signal RX does not match the wakeup sequence, then signal WAKE_NOK is asserted at time $t_{24}$, which causes signal WAKE_OSC to be deasserted at time $t_{24}$, thereby causing oscillator 126 to be disabled. As shown in FIG. 11, when a non-compliant wakeup sequence is received from communication bus 144, main FSM 138 remains in standby state 306.

Figure 12:
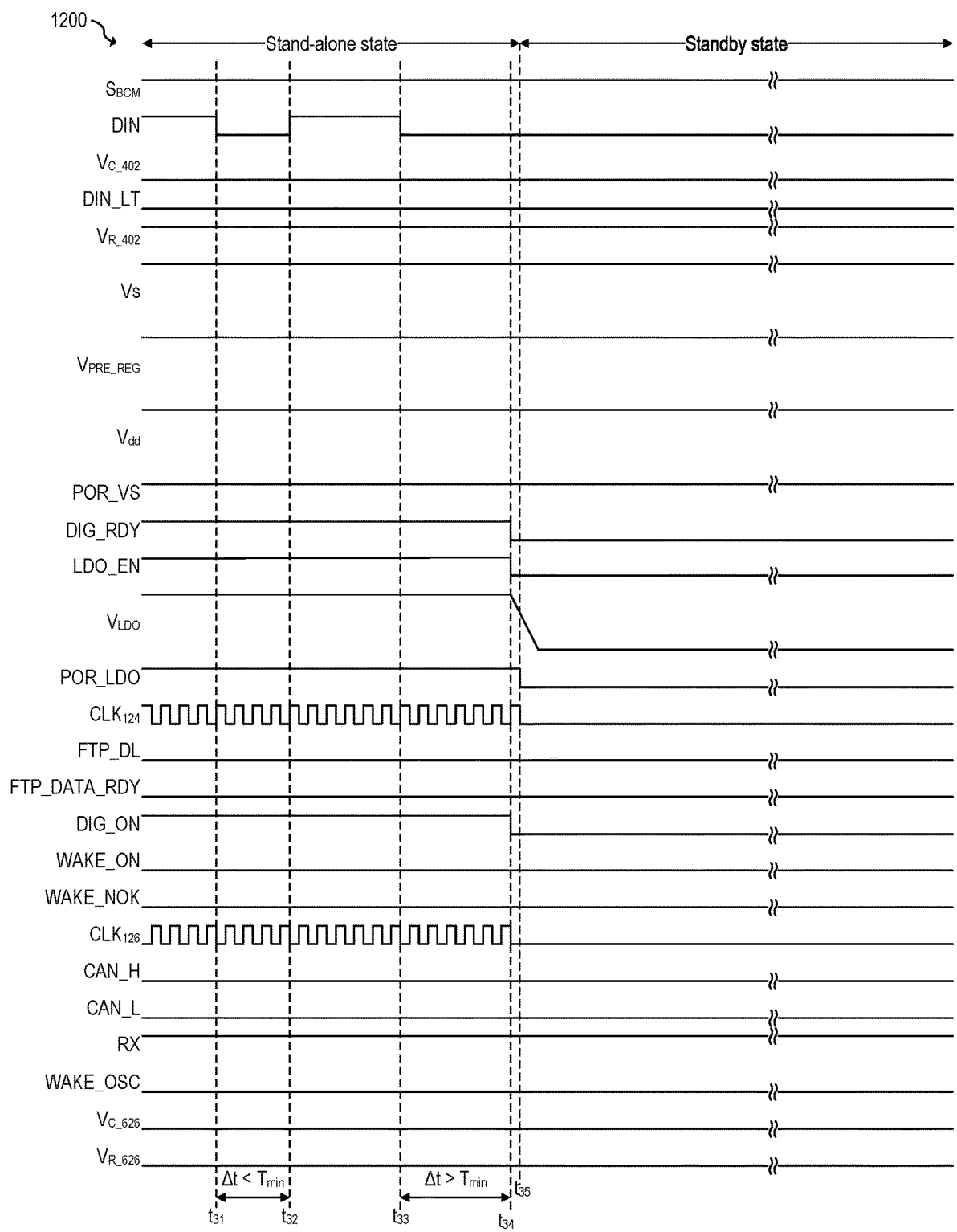

FIG. 12 shows waveforms 1200 associated with IC 102, according to an embodiment of the present invention. Waveforms 1200 are associated with IC 102 with pin or pad 114 coupled to local BCM 106 implemented with local BCM 500 without having node $V_{504}$ coupled to DIN (e.g., without resistors 508 and 510), and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 700 illustrate the transition from stand-alone state 310 directly to standby state 306, based on the deassertion of signal DIN.

As shown in FIG. 12, when signal DIN is deasserted for a period shorter than $T_{min}$, main FSM 138 remains in standby state. When signal DIN is deasserted for a period equal to or longer than $T_{min}$, main FSM 138 deasserts signals DIG_RDY and DIG_ON, as shown at time $t_{34}$. Deasserting signals DIG_RDY and DIG_ON causes signal LDO_EN to be deasserted (thereby disabling LDO 202) and disabling oscillator 126. When voltage $V_{LDO}$ decreases below $V_{LDO\_THRES}$ at time $t_4$, signal POR_LDO is deasserted, which causes oscillator 124 to turn off. Main FSM 138 enters standby state 306 at time $t_{35}$.

Figure 13:
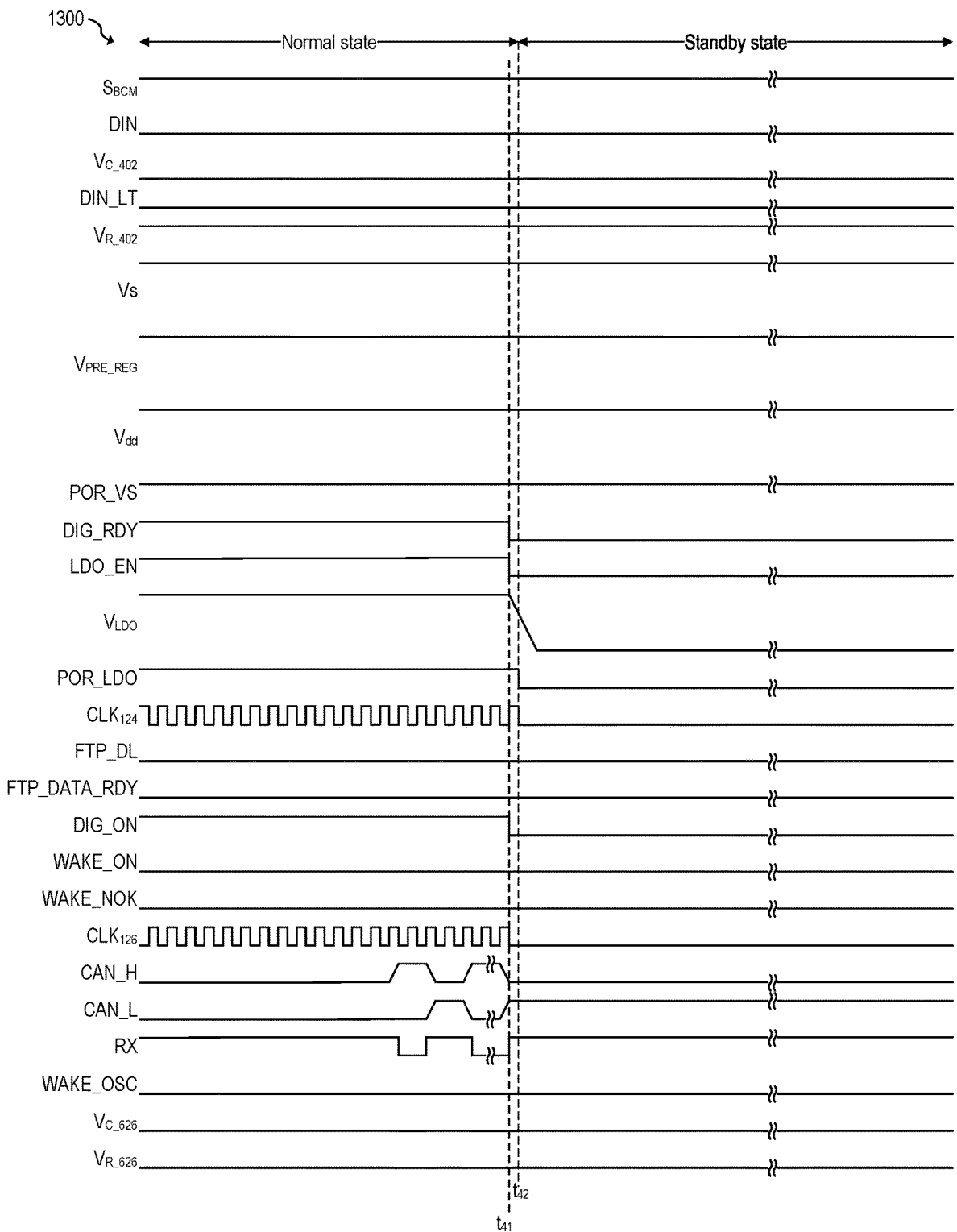

FIG. 13 shows waveforms 1300 associated with IC 102, according to an embodiment of the present invention. Waveforms 1300 are associated with IC 102 with pin or pad 114 coupled to local BCM 106 implemented with local BCM 500 without having node $V_{504}$ coupled to DIN (e.g., without resistors 508 and 510), and implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 1300 illustrate the transition from normal state 312 directly to standby state 306, based on the reception of a go-to-sleep command from communication bus 144.

As shown in FIG. 13, at time $t_{41}$, handler logic 604 receives a go-to-sleep command from communication bus 144. Upon reception of a go-to-sleep command, main FSM 138 deasserts signals DIG_RDY and DIG_ON, as shown at time $t_{41}$. Deasserting signals DIG_RDY and DIG_ON causes signal LDO_EN to be deasserted (thereby disabling LDO 202) and disabling oscillator 126. When voltage $V_{LDO}$ decreases below $V_{LDO\_THRES}$ at time $t_{42}$, signal POR_LDO is deasserted, which causes oscillator 124 to turn off. Main FSM 138 enters standby state 306 at time $t_{42}$.

Figure 14:
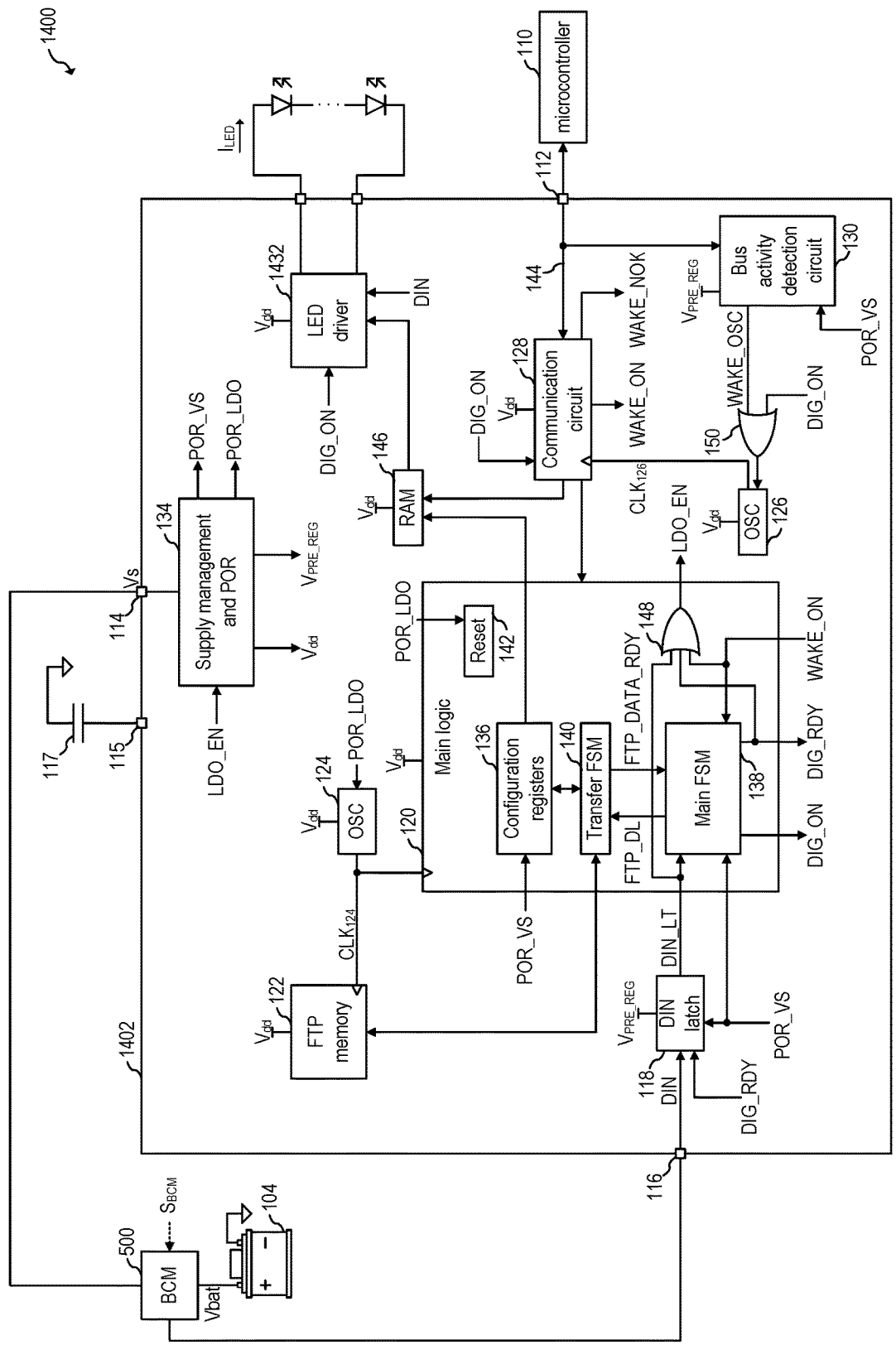
FIG. 14 shows an automotive system including an IC, according to an embodiment of the present invention.

FIG. 14 shows automotive system 1400, according to an embodiment of the present invention. Automotive system 1400 includes IC 1402, car battery 104, local BCM 500, and microcontroller 110. IC 1402 includes input latch 118, main logic circuit 120, FTP memory 122, oscillators 124 and 126, communication circuit 128, bus activity detection circuit 130, LED driver 1432, and supply management and POR circuit 134. Automotive system 100 may be implemented as automotive system 1400. IC 102 may be implemented as IC 1402. Analog circuit 132 may be implemented as LED driver 1432.

IC 1402 operates in a similar manner as IC 102. IC 1402, however, implements analog circuit 132 as LED driver 1432 for driving a plurality of LEDs. As shown, LED driver 1432 may be controlled using input signal DIN, e.g., when FSM 138 is in stand-alone state 310. For example, in some embodiments, the duty cycle of signal DIN may be proportional to the average current $I_{LED}$.

In some embodiments, LED driver 1432 is configured to drive a plurality of LEDs that are external to IC 1402. LED driver 1432 may be implemented in any way known in the alt. For example, in some embodiments, LED driver 1432 includes a current control buck converter for regulating the current $I_{LED}$. Other implementations are also possible.

Figure 15:
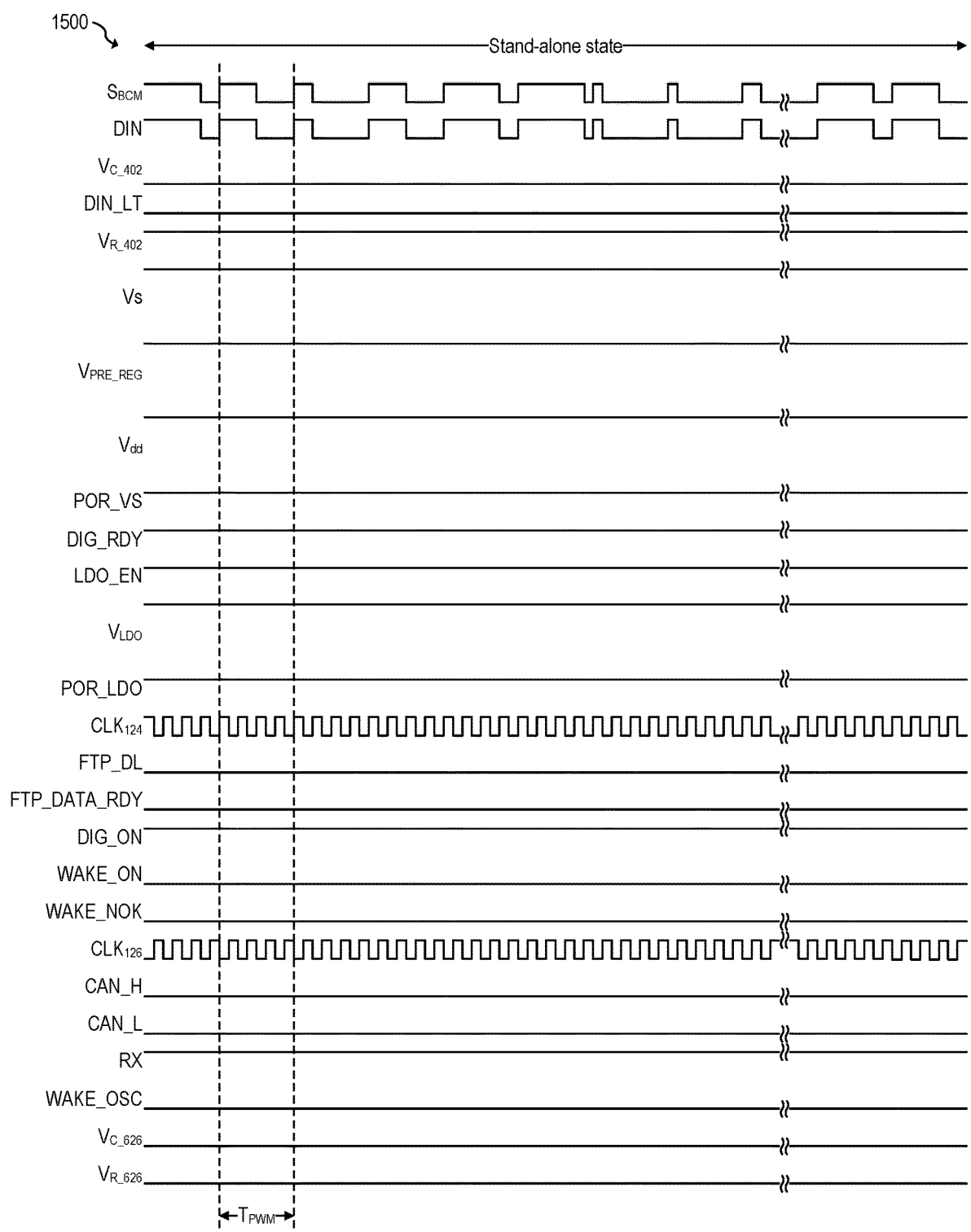
FIG. 15 shows waveforms associated with the IC of FIG. 14, according to an embodiment of the present invention.

FIG. 15 shows waveforms 1500 associated with IC 1402, according to an embodiment of the present invention. Waveforms 1500 are associated with IC 1402 implementing DIN latch 118, communication interface 128, bus activity detection circuit 130, and supply management and POR circuit 134, as DIN latch 400, communication interface 602, bus activity detection circuit 604, and supply management and POR circuit 200, respectively. Waveforms 1500 illustrate the transition from power down state 302 to initialization state 304, and then to standby state 306, as well as waking up from standby state 306 based on the assertion of signal DIN.

As shown in FIG. 15, LED driver 1432 may be controlled by modulating signal DIN in a PWM manner (e.g., by modulating signal $S_{BCM}$ in a PWM manner). Keeping the switching period $T_{PWM}$ lower than $T_{min}$ advantageously avoid causing main FSM 138 to transition into standby state 306.

Example embodiments of the present invention are summarized here. Other embodiments can also be understood from the entirety of the specification and the claims filed herein.

Example 1. An electronic circuit including: a first circuit; a non-volatile memory configured to store configuration data for configuring the first circuit; a first oscillator having an output configured to deliver a first clock signal when the first oscillator is enabled; a supply management circuit configured to receive an input supply voltage at an input of the supply management circuit, and provide a first supply voltage from the input supply voltage at a first output of the supply management circuit; and a main circuit coupled to the output of the first oscillator and including a plurality of configuration registers, the main circuit configured to: when the input supply voltage becomes higher than a first threshold, cause the electronic circuit to transition into an initialization state in which the first oscillator is enabled and the configuration data is copied from the non-volatile memory to the plurality of configuration registers, after the configuration data is copied from the non-volatile memory to the plurality of configuration registers, cause the electronic circuit to transition into a standby state in which the first oscillator is disabled, and content of the plurality of configuration registers is preserved by the first supply voltage, and when the electronic circuit is in the standby state, upon reception of a wakeup event, cause the configuration data from the plurality of configuration registers to be applied to the first circuit, and cause the electronic circuit to transition into an active state in which the first oscillator is enabled and the first circuit is configured to operate based on the configuration data applied from the plurality of configuration registers.

Example 2. The electronic circuit of example 1, where the main circuit includes a finite state machine (FSM).

Example 3. The electronic circuit of one of examples 1 or 2, further including a volatile memory, where the main circuit is configured to copy the configuration data from the plurality of configuration registers to the volatile memory to apply the configuration data to the first circuit.

Example 4. The electronic circuit of one of examples 1 to 3, where the supply management circuit includes: a pre-regulator configured to generate at an output of the pre-regulator a first voltage from the input supply voltage; and a main voltage regulator configured to generate at an output of the main voltage regulator a second voltage from the input supply voltage when the main voltage regulator is enabled, where, when the electronic circuit is in the standby state, the main voltage regulator is configured to be disabled and the supply management circuit is configured to connect the output of the pre-regulator to the first output of the supply management circuit, and when the electronic circuit is in the active state, the main voltage regulator is configured to be enabled and the supply management circuit is configured to disconnect the output of the pre-regulator from the first output of the supply management circuit and connect the output of the main voltage regulator to the first output of the supply management circuit.

Example 5. The electronic circuit of one of examples 1 to 4, where the pre-regulator is configured to be an always-on voltage regulator.

Example 6. The electronic circuit of one of examples 1 to 5, where the supply management circuit includes: a first comparator configured to assert a first control signal when the first voltage becomes higher than a second threshold; a second comparator configured to assert a second control signal when the second voltage becomes higher than a third threshold; a first switch coupled between the output of the pre-regulator and the output of the supply management circuit, where the first switch is configured to be closed when the second control signal is deasserted and open when the second control signal is asserted; and a second switch coupled between the output of the main voltage regulator and the output of the supply management circuit, where the second switch is configured to be closed when the second control signal is asserted and open when the second control signal is deasserted.

Example 7. The electronic circuit of one of examples 1 to 6, where the second control signal is configured to cause the first oscillator to be enabled when the second control signal is asserted, and cause the first oscillator to be disabled when the second control signal is deasserted.

Example 8. The electronic circuit of one of examples 1 to 7, further including an input latch having an output configured to assert a first control signal to cause a wakeup event based on an input of the input latch.

Example 9. The electronic circuit of one of examples 1 to 8, further including a fail-safe circuit coupled to the input of the input latch.

Example 10. The electronic circuit of one of examples 1 to 9, where the input latch includes: a flip-flop having an output configured to generate the first control signal; and a delay circuit coupled between the input of the input latch and an input of the flip-flop, where the input latch is configured to reset the flip-flop a first time after the electronic circuit transitions out of the standby state.

Example 11. The electronic circuit of one of examples 1 to 10, further including a communication circuit configured to be coupled to a communication bus, and having an output configured to, when the electronic circuit is in the standby state, assert a first control signal to cause a wakeup event based on communication data from the communication bus.

Example 12. The electronic circuit of one of examples 1 to 11, where the communication circuit includes a controller area network (CAN) interface.

Example 13. The electronic circuit of one of examples 1 to 12, further including: a second oscillator having an output configured to deliver a second clock signal when the second oscillator is enabled, where the output of the second oscillator is coupled to the communication circuit, and where the second oscillator is configured to be disabled when the electronic circuit is in the standby state; and a bus activity detection circuit configured to, when the electronic circuit is in the standby state, detect activity in the communication bus, and enable the second oscillator when the bus activity detection circuit detects activity in the communication bus.

Example 14. The electronic circuit of one of examples 1 to 13, where, when the electronic circuit is in the standby state and the second oscillator is enabled, the communication circuit is configured to detect a wakeup sequence based on data from the communication bus, when the wakeup sequence matches a predetermined wakeup sequence, the communication circuit is configured to cause the electronic circuit to transition from the standby state into the active state, and, when the wakeup sequence does not match the predetermined wake-up sequence, the communication circuit is configured to cause the second oscillator to be disabled.

Example 15. The electronic circuit of one of examples 1 to 14, where the communication circuit includes: a physical layer circuit coupled to the communication bus and having an output; and a handler circuit having a clock input coupled to the output of the second oscillator, and a data input coupled to the output of the physical layer circuit, and where the activity bus detection circuit includes: a flip-flop having an output coupled to an enable input of the second oscillator, and a delay circuit coupled between the output of the physical layer circuit and a first input of the flip-flop.

Example 16. The electronic circuit of one of examples 1 to 15, further including a microcontroller coupled to the communication bus, the microcontroller configured to communicate with the communication circuit via the communication bus.

Example 17. The electronic circuit of one of examples 1 to 16, further including a local body control module (BCM) having a switch coupled between a battery and the input of the supply management circuit, where the local BCM is configured to control the switch based on a BCM signal.

Example 18. The electronic circuit of one of examples 1 to 17, where, when the electronic circuit is in the active state, the BCM signal is a pulse-width modulated (PWM) signal.

Example 19. The electronic circuit of one of examples 1 to 18, where the local BCM further includes: a diode coupled to the input of the of the supply management circuit; a tank capacitor coupled to the input of the supply management circuit; and a voltage divider coupled to a first input of the main circuit, where asserting the first input of the main circuit is configured to cause a wakeup event.

Example 20. The electronic circuit of one of examples 1 to 19, where the non-volatile memory includes a serial few times programmable (FTP) memory.

Example 21. The electronic circuit of one of examples 1 to 20, where the first circuit is an analog circuit.

Example 22. The electronic circuit of one of examples 1 to 21, where the first circuit includes a light emitting diode (LED) driver circuit.

Example 23. The electronic circuit of one of examples 1 to 22, where the electronic circuit is integrated in an integrated circuit.

Example 24. An integrated circuit including: a first circuit; an embedded memory configured to store configuration data for configuring the first circuit; a first oscillator having an output configured to deliver a first clock signal when the first oscillator is enabled; a supply management circuit configured to receive an input supply voltage at an input of the supply management circuit, and provide a first supply voltage from the input supply voltage at a first output of the supply management circuit, where the supply management circuit includes: a pre-regulator configured to generate at an output of the pre-regulator a first voltage from the input supply voltage, and a main voltage regulator configured to generate at an output of the main voltage regulator a second voltage from the input supply voltage when the main voltage regulator is enabled, where the pre-regulator is configured to consume less power than the main voltage regulator, a first comparator configured to assert a first control signal when the first voltage becomes higher than a first threshold, a second comparator configured to assert a second control signal when the second voltage becomes higher than a second threshold, a first switch coupled between the output of the pre-regulator and the output of the supply management circuit, where the first switch is configured to be closed when the second control signal is deasserted and open when the second control signal is asserted, and a second switch coupled between the output of the main voltage regulator and the output of the supply management circuit, where the second switch is configured to be closed when the second control signal is asserted and open when the second control signal is deasserted; a volatile memory coupled to the first circuit; and a main circuit coupled to the output of the first oscillator and to the output of the supply management circuit, the main circuit including a plurality of configuration registers, where the main circuit is configured to: when the first control signal is asserted, cause the integrated circuit to transition into an initialization state in which the first oscillator is enabled and the configuration data is copied from the embedded memory to the plurality of configuration registers, after the configuration data is copied from the embedded non-volatile memory to the plurality of configuration registers, cause the integrated circuit to transition into a standby state in which the first oscillator is disabled, and content of the plurality of configuration registers is preserved by the first voltage, and when the integrated circuit is in the standby state, upon reception of a wakeup event, cause the configuration data from the plurality of configuration registers to be copied to the volatile memory, and cause the integrated circuit to transition into an active state in which the first oscillator is enabled and the first circuit is configured to operate based on the configuration data stored in the volatile memory.

Example 25. The integrated circuit of example 24, further including a communication circuit configured to be coupled to a communication bus, where, when the integrated circuit is in the active state, the integrated circuit is configured to control the first circuit based on data from the communication bus.

Example 26. A method including: receiving an input supply voltage with a supply input of an integrated circuit; powering a pre-regulator of the integrated circuit with the input supply voltage; when a pre-regulator output voltage is higher than a predetermined threshold, assert a first control signal; when the first control signal is asserted, cause the integrated circuit to transition into an initialization state in which a first oscillator is enabled and configuration data is copied from an embedded non-volatile memory of the integrated circuit to a plurality of configuration registers of the integrated circuit; after the configuration data is copied from the embedded non-volatile memory to the plurality of configuration registers, causing the integrated circuit to transition into a standby state in which the first oscillator and a main voltage regulator are disabled, and content of the plurality of configuration registers is preserved by the pre-regulator output voltage; and when the integrated circuit is in the standby state, receiving a wakeup event, in response to receiving the wakeup event, applying the configuration data from the plurality of configuration registers to a first circuit of the integrated circuit, and causing the integrated circuit to transition into an active state in which the first oscillator and the main voltage regulator are enabled and the first circuit operates based on the configuration data stored in the plurality of configuration registers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic circuit comprising:
   a first circuit;
   a non-volatile memory configured to store configuration data for configuring the first circuit;
   a first oscillator having an output configured to deliver a first clock signal when the first oscillator is enabled; and
   a main circuit coupled to the output of the first oscillator and comprising a plurality of configuration registers, wherein the first circuit, the non-volatile memory, the first oscillator, and the main circuit are integrated in an integrated circuit, and wherein the main circuit is configured to:
      when an input supply voltage becomes higher than a first threshold, cause the integrated circuit to transition into an initialization state in which the first oscillator is enabled and the configuration data are copied from the non-volatile memory to the plurality of configuration registers,
      after the configuration data are copied from the non-volatile memory to the plurality of configuration registers, cause the integrated circuit to transition into a standby state in which the first oscillator is disabled and content of the plurality of configuration registers is preserved, and
      when the integrated circuit is in the standby state, upon reception of a wakeup event, cause the configuration data from the plurality of configuration registers to be applied to the first circuit, and cause the integrated circuit to transition into an active state in which the first oscillator is enabled and the first circuit is configured to operate based on the configuration data applied from the plurality of configuration registers.

2. The electronic circuit of claim 1, wherein the integrated circuit further comprises an input latch having an output configured to assert a first control signal to cause a wakeup event based on an input of the input latch.

3. The electronic circuit of claim 2, wherein the integrated circuit comprises an input latch terminal coupled to an input of the input latch, the input latch terminal configured to receive an input latch signal, wherein the input latch is configured to control the first control signal based on the input latch signal.

4. The electronic circuit of claim 3, wherein the first circuit comprises first input configured to receive the input latch signal, and wherein the first circuit is further configured to operate based on the input latch signal.

5. The electronic circuit of claim 4, wherein the first circuit comprises a light emitting diode (LED) driver having an input coupled to the input latch terminal and configured to receive the input latch signal, wherein the LED driver is configured to operate based on a duty cycle of the input latch signal.

6. The electronic circuit of claim 3, further comprising:
   a supply management circuit configured to receive the input supply voltage at an input of the supply management circuit, and provide a first supply voltage from the input supply voltage at a first output of the supply management circuit; and
   a local body control module (BCM) having a switch coupled between a battery terminal configured to receive a battery voltage and the input of the supply management circuit, wherein the local BCM is configured to control the switch based on a BCM signal.

7. The electronic circuit of claim 6, wherein the switch is coupled to the input latch terminal via a voltage divider.

8. The electronic circuit of claim 6, wherein an assertion of the BCM signal is configured to trigger a transition of the integrated circuit to the into the initialization state.

9. The electronic circuit of claim 3, wherein the integrated circuit further comprises a supply management circuit that comprises:
   a pre-regulator configured to generate at an output of the pre-regulator a first voltage from the input supply voltage;
   a main voltage regulator configured to generate at an output of the main voltage regulator a second voltage from the input supply voltage when the main voltage regulator is enabled;
   a first comparator configured to compare the first voltage with a first threshold voltage, the first comparator having an output configured to deliver a second control signal; and
   a second comparator configured to compare the second voltage with a second threshold voltage, the second comparator having an output configured to deliver a third control signal, wherein:
      the first comparator is configured to assert the second control signal during the initialization state, and
      the second comparator is configured to assert the third control signal during the initialization state, and deassert the third control signal during the standby state.

10. The electronic circuit of claim 9, wherein the first oscillator is configured to be enabled or disabled based on the third control signal, and wherein the configuration registers are configured to be reset based on the second control signal.

11. The electronic circuit of claim 9, wherein the integrated circuit is configured to, in response to an assertion of the input latch signal, enable the main voltage regulator and copy the configuration data from the plurality of configuration registers into a volatile memory, wherein the first circuit is configured to operate based on content of the volatile memory.

12. The electronic circuit of claim 3, wherein the integrated circuit is configured to transition from the active state into the standby state when the input latch signal is deasserted for a period longer than a predetermined time.

13. The electronic circuit of claim 1, wherein the integrated circuit further comprises:
communication bus terminals; and
a communication circuit coupled to the communication bus terminals and having an output configured to, when the integrated circuit is in the standby state, assert a first control signal to cause a wakeup event based on the communication bus terminals.

14. The electronic circuit of claim 13, wherein the integrated circuit further comprises:
a second oscillator having an output configured to deliver a second clock signal when the second oscillator is enabled, wherein the output of the second oscillator is coupled to the communication circuit; and
a bus activity detection circuit configured to, when the integrated circuit is in the standby state,
detect bus activity based on the communication bus terminals, and
enable the second oscillator when bus activity is detected.

15. The electronic circuit of claim 14, wherein, during the standby state, the communication circuit is configured to:
determine a wakeup sequence based on the communication bus terminals;
when the wakeup sequence matches a predetermined wakeup sequence, cause the integrated circuit to transition from the standby state into the active state; and
when the wakeup sequence does not match the predetermined wakeup sequence, cause the second oscillator to be disabled.

16. A method comprising:
receiving an input supply voltage;
powering a pre-regulator and a main voltage regulator with the input supply voltage;
when a pre-regulator output voltage of the pre-regulator is higher than a first predetermined threshold, asserting a first control signal;
when a main output voltage of the main voltage regulator is higher than a second predetermined threshold, asserting a second control signal;
when the first and second control signals are asserted, enabling a first oscillator, and copying configuration data from a non-volatile memory to a plurality of configuration registers;
after the configuration data are copied from the non-volatile memory to the plurality of configuration registers, disabling the main voltage regulator; and
when an input latch signal is asserted,
enabling the main voltage regulator,
copying the configuration data from the plurality of configuration registers to a rapid access memory (RAM), and
operate a first circuit based on content from the RAM.

17. The method of claim 16, further comprising:
asserting the input latch signal before the configuration data are copied from the non-volatile memory to the plurality of configuration registers, and
keeping the input latch signal asserted during while the configuration data are copied from the non-volatile memory to the plurality of configuration registers, wherein enabling the main voltage regulator when the input latch signal is asserted comprises enabling the main voltage regulator so as to prevent a de-assertion of the second control signal.

18. The method of claim 16, wherein the pre-regulator and the main voltage regulator are part of a supply management circuit having an output for powering the plurality of configuration registers, wherein, the method further comprising:
when the second control signal is asserted, providing the output of the supply management circuit with the main output voltage; and
when the second control signal is deasserted, providing the output of the supply management circuit with the pre-regulator output voltage.

19. The method of claim 16, further comprising:
when the input latch signal is asserted, deasserting the input latch signal; and
in response to deasserting the input latch signal, copying the configuration data from the non-volatile memory to the plurality of configuration registers, and after the configuration data are copied from the non-volatile memory to the plurality of configuration registers, disabling the main voltage regulator.

20. A method comprising:
receiving an input supply voltage with a first input of an integrated circuit;
powering a supply management circuit of the integrated circuit with the input supply voltage;
powering a plurality of configuration registers of the integrated circuit with an output of the supply management circuit;
when the input supply voltage becomes higher than a first threshold, causing the integrated circuit to transition into an initialization state in which a first oscillator of the integrated circuit is enabled and configuration data are copied from a non-volatile memory of the integrated circuit to the plurality of configuration registers;
after the configuration data are copied from the non-volatile memory to the plurality of configuration registers, causing the integrated circuit to transition into a standby state in which the first oscillator is disabled, and content of the plurality of configuration registers are preserved by the output of the supply management circuit; and
when the integrated circuit is in the standby state, upon reception of a wakeup event, causing the configuration data from the plurality of configuration registers to be applied to a first circuit, and causing the integrated circuit to transition into an active state in which the first oscillator is enabled and the first circuit operates based on the configuration data applied from the plurality of configuration registers.

* * * * *

UNITED STATES PATENT AND TRADEMARK OFFICE
CERTIFICATE OF CORRECTION

PATENT NO. : 11,726,542 B2
APPLICATION NO. : 17/883266
DATED : August 15, 2023
INVENTOR(S) : Vincenzo Polisi et al.

It is certified that error appears in the above-identified patent and that said Letters Patent is hereby corrected as shown below:

In the Claims

Claim 8, Column 22, Line 41; delete "into the" after "to the".

Signed and Sealed this
Twenty-eighth Day of November, 2023

Katherine Kelly Vidal
*Director of the United States Patent and Trademark Office*